US009685966B2

(12) United States Patent
Chen et al.

(10) Patent No.: US 9,685,966 B2
(45) Date of Patent: Jun. 20, 2017

(54) FRACTIONAL DIVIDING MODULE AND RELATED CALIBRATION METHOD

(71) Applicant: MEDIATEK INC., Hsin-Chu (TW)

(72) Inventors: Pang-Ning Chen, Taipei (TW); Yu-Li Hsueh, New Taipei (TW); Jian-Yu Ding, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/922,203

(22) Filed: Oct. 26, 2015

(65) Prior Publication Data

US 2016/0156364 A1    Jun. 2, 2016

Related U.S. Application Data

(60) Provisional application No. 62/086,310, filed on Dec. 2, 2014.

(51) Int. Cl.
*H03L 7/197* (2006.01)
*H03L 7/081* (2006.01)
*H03K 21/02* (2006.01)
*H03K 23/42* (2006.01)

(52) U.S. Cl.
CPC ......... *H03L 7/1976* (2013.01); *H03K 21/023* (2013.01); *H03K 23/42* (2013.01); *H03L 7/081* (2013.01); *H03L 7/1974* (2013.01)

(58) Field of Classification Search
CPC ..... H03L 7/1976; H03L 7/081; H03L 7/1974; H03K 21/023; H03K 23/42
USPC ........................................ 327/115
See application file for complete search history.

(56) References Cited

U.S. PATENT DOCUMENTS

| 6,873,213 | B2 * | 3/2005 | Tsuda | H03L 7/1976 331/1 A |
|---|---|---|---|---|
| 7,162,002 | B2 | 1/2007 | Chen | |
| 7,181,180 | B1 | 2/2007 | Teo | |
| 2003/0062959 | A1 * | 4/2003 | Tsuda | H03L 7/1976 331/17 |
| 2006/0220697 | A1 * | 10/2006 | Flynn | H03K 23/68 327/105 |
| 2009/0213980 | A1 * | 8/2009 | Ding | H03K 23/584 377/48 |

(Continued)

OTHER PUBLICATIONS

Yu, A Delta-Sigma Fractional-N Synthesizer With Customized Noise Shaping for WCDMA/HSDPA Applications, IEEE Journal of Solid-State Circuits, vol. 44, No. 8, Aug. 2009.

(Continued)

*Primary Examiner* — Ryan Jager
(74) *Attorney, Agent, or Firm* — Winston Hsu; Scott Margo

(57) ABSTRACT

A fractional dividing module includes an output clock generating circuit, for receiving an input clock signal and generating an output clock signal according to a first control signal, comprising a first delay unit, for delaying the input clock signal to generate a delayed input clock signal; and a selecting unit, for selecting one of the input clock signal and the delayed input clock signal to generate the output clock signal according to the first control signal; and a control circuit, for dividing the output clock signal to generate the first control signal according to a dividing control signal, wherein the dividing control is adjusted to control a frequency ratio between the output clock signal and the input clock signal.

29 Claims, 22 Drawing Sheets

(56) References Cited

U.S. PATENT DOCUMENTS

2013/0027111 A1* 1/2013 Chen .................... H03K 23/667
327/360
2016/0156364 A1* 6/2016 Chen .................... H03K 21/023
327/115

OTHER PUBLICATIONS

Heng, A 1.8-GHz CMOS Fractional-N Frequency Synthesizer With Randomized Multiphase VCO, IEEE Journal of Solid-State Circuits, vol. 38, No. 6, Jun. 2003.
Su, A 2-MHz Bandwidth Delta-Sigma Fractional-N Synthesizer Based on a Fractional Frequency Divider with Digital Spur Suppression, 2010 IEEE Radio Frequency Integrated Circuits Symposium.
Pamarti, A Wideband 2.4-GHz Delta-Sigma Fractional-N PLL With 1-Mb/s In-Loop Modulation, IEEE Journal of Solid-State Circuits, vol. 39, No. 1, Jan. 2004.
Kao, A Wideband Fractional-N Ring PLL with Fractional-Spur Suppression Using Spectrally Shaped Segmentation, ISSCC 2013 / Session 23 / Short-Reach Links, XCVR Techniques, & PLLS / 23.9, pp. 416-417 and Figure 23.9.7.
Gupta, A 1.8-GHz Spur-Cancelled Fractional-N Frequency Synthesizer With LMS-Based DAC Gain Calibration, IEEE Journal of Solid-State Circuits, vol. 41, No. 12, Dec. 2006.
Zanuso, A Wideband 3.6 GHz Digital Delta-Sigma Fractional-N PLL With Phase Interpolation Divider and Digital Spur Cancellation, IEEE Journal of Solid-State Circuits, vol. 46, No. 3, Mar. 2011.

* cited by examiner

FRACTIONAL DIVIDING MODULE AND RELATED CALIBRATION METHOD

CROSS REFERENCE TO RELATED APPLICATIONS

This application claims the benefit of U.S. Provisional Application No. 62/086,310 filed on 2014 Dec. 2, the contents of which are incorporated herein in their entirety.

BACKGROUND

The present invention relates generally to a fractional dividing module and related calibration method.

In a traditional Integer-N PLL, if finer output frequency resolution is desired, one approach is to pre-divide the input clock in order to lower the reference clock frequency. Since the output frequency is an integer (N) times the input frequency, a slower reference clock results in a finer frequency resolution. Using this approach, the maximum achievable PLL bandwidth is reduced since the loop bandwidth should not greatly exceed 10% of the reference clock frequency. Lowering the loop bandwidth causes VCO (voltage-controlled oscillator) phase noises and layout area increase due to the larger capacitors sizes required in the loop filter. The other approach to achieve finer frequency resolution with an integer-N PLL is to increase the output frequency and then divide the resulting VCO output clock. The disadvantage of the approach is power consumption increases due to the higher clock rate.

Generally, an approach to derive finer output frequency resolution is to use a Fractional-N PLL. With this approach, the feedback divider is typically controlled by a delta-sigma modulator, and the average divisor provided by the feedback divider is utilized to obtain the desired (fractional) value. Using a delta-sigma modulator to control the feedback divider, the quantization noise induced by the modulator will be shaped such that it is placed mostly at higher frequencies. The quantization noise can then be attenuated by the PLL's low-pass characteristic as seen at its input. While the Fractional-N approach enables a higher reference clock rate thereby enabling a higher loop bandwidth as set by stability constraints, the filtering constraints imposed by quantization noise may still limit the loop bandwidth to an undesired level.

The quantization noise of the fractional-N PLL can be reduced by shrinking the quantization level of the feedback divider in the fractional-N PLL. For example, the quantization error is halved if the quantization level of the feedback divider is halved (e.g. from 1 to 0.5). Thus, a feedback divider with finer quantization level is at issue.

SUMMARY

In order to solve the above problem, the present invention provides a fractional dividing module with a quantization level of power of 0.5 and related calibration method.

The present invention discloses a fractional dividing module. The fractional dividing module comprises an output clock generating circuit, for receiving an input clock signal and generating an output clock signal according to a first control signal, comprising: a first delay unit, for delaying the input clock signal to generate a delayed input clock signal; and a selecting unit, for selecting one of the input clock signal and the delayed input clock signal to generate the output clock signal according to the first control signal; and a control circuit, for dividing the output clock signal to generate the first control signal according to a dividing control signal, wherein the dividing control is adjusted to control a frequency ratio between the output clock signal and the input clock signal.

The present invention further discloses a fractional dividing module. The fractional dividing module comprises a control circuit, for generating N selecting control signals according to a first output clock signal and a fractional divisor and a dividing control signal according to the fractional divisor; N dividing cells, for generating a second output clock signal according to an input clock signal and the plurality of selecting control signals; and a dividing unit, for dividing the second output clock signal by a rational number according to the dividing control signal to generate the first output clock signal, wherein a quantization level of the rational number is 1; wherein the $i^{th}$ dividing cell among N dividing cells outputs one of a $i^{th}$ cell input clock signal and a $i^{th}$ cell delayed clock signal as a $i^{th}$ cell output clock signal according to the $i^{th}$ control signal, wherein the $i^{th}$ cell delayed clock signal is generated by delaying the $i^{th}$ cell input clock signal $0.5^i$ of a clock period of the input clock signal; wherein the input clock signal is the cell input clock signal of a first dividing cell among the N dividing cells, the second output clock signal is the cell output signal of a second dividing cell among the N dividing cells, and the cell input clock signal of each of the dividing cells except the first dividing cell and the second dividing cell, hereinafter third dividing cells, is the cell output clock signal of another dividing cell among the N dividing cells.

The present invention further discloses a calibration method for a fractional dividing module comprising a control circuit, for generating N selecting control signals according to a first output clock signal and a fractional divisor; N dividing cells, for generating an second output clock signal according to an input clock signal and the plurality of selecting control signals; and a dividing unit, for dividing the second output clock signal by a rational number according to the dividing control signal to generate the first output clock signal, wherein a quantization level of the rational number is 1; wherein the $i^{th}$ dividing cell among N dividing cells outputs one of a $i^{th}$ cell input clock signal and a $i^{th}$ cell delayed clock signal as a $i^{th}$ cell output clock signal according to the $i^{th}$ control signal, wherein the $i^{th}$ cell delayed clock signal is generated by delaying the $i^{th}$ cell input clock signal $0.5^i$ of a clock period of the input clock signal; wherein the input clock signal is the cell input clock signal of a first dividing cell among the N dividing cells, the second output clock signal is the cell output signal of a second dividing cell among the N dividing cells, and the cell input clock signal of each of the dividing cells except the first dividing cell and the second dividing cell, hereinafter third dividing cells, is the cell output clock signal of another dividing cell among the N dividing cells. The calibration method comprises controlling the fractional dividing module to perform a function of divided-by-$(1+0.5^m)$, wherein m is a positive integer smaller than the number N of the delay cells; and adjusting a delay time of the first delay units in the in $m^{th}$ delay cell according to the input clock signal and the first output clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
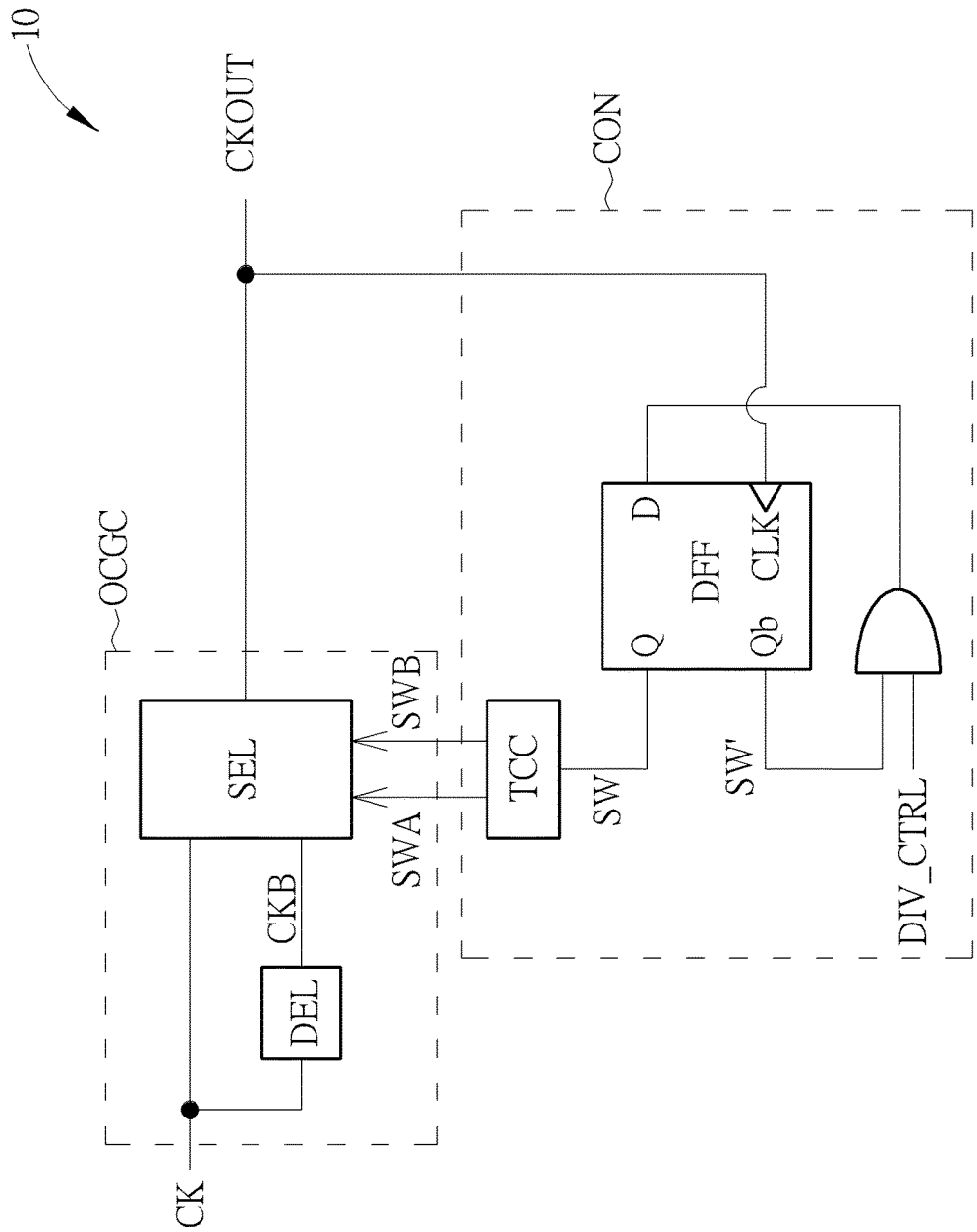
FIG. 1 is a schematic diagram of a fractional dividing module according to an example of the present invention.

Please refer to FIG. 1, which is a schematic diagram of a fractional dividing module 10 according to an example of the present invention. The fractional dividing module 10 may be a divider in an integrated circuit (e.g. a phase-locked-loop (PLL) based frequency synthesizer), and is not limited herein. As shown in FIG. 1, the fractional dividing module 10 comprises an output clock generating circuit OCGC and a control circuit CON. The output clock generating circuit OCGC comprises a delay unit DEL and a selecting unit SEL. The delay unit DEL is utilized for delaying an input clock signal CK half of a period TCK of the input clock signal CK, to generate a delayed input clock signal CKB. Note that, the delay unit DEL may be omitted if the delayed input clock signal CKB can be provided by other circuits in the integrated circuit. The selecting unit SEL is utilized for outputting one of the input clock signal CK and the delayed input clock signal CKB as an output clock signal CKOUT according to selecting control signals SWA and SWB. Note that, the selecting control signal SWB is the inverse signal of the selecting control signal SWA. Thus, the selecting control signals SWA and SWB can be regarded as the same signal. Or, the selecting unit SEL may only receive the selecting control signal SWA and generate the selecting control signal SWB itself. The control circuit CON is utilized for generating the selecting control signals SWA and SWB according to a dividing control signal DIV_CTRL and the output clock signal CKOUT. By adjusting the dividing control signal DIV_CTRL, the divisor of the fractional dividing module 10 (i.e. the frequency ratio between the output clock signal CKOUT and the input clock signal CK) is switched between 1 and 1.5. That is, the fractional dividing module 10 provides the divide-by-1.5 function.

In details, the control circuit CON maintains the selecting control signal SWA to a high logic level (i.e. "1") and the selecting control signal SWB to a low logic level (i.e. "0") when the dividing control signal DIV_CTRL indicates the divisor 1 (e.g. when the dividing control signal DIV_CTRL is "0"), to make the selecting unit SEL output the input clock signal CK as the output clock signal CKOUT. When the dividing control signal DIV_CTRL indicates the divisor 1.5 (e.g. when the dividing control signal DIV_CTRL is "1"), the control circuit CON generates the selecting control signal SWA via dividing the output clock signal CKOUT by 2 and generates the inverse signal of the selecting control signal SWA as SWB. For example, the control circuit CON switches the selecting control signals SWA and SWB every 2 contiguous rising edges of the output clock signal CKOUT. In such a condition, the period of the output clock signal CKOUT becomes 1.5 times the period TCK.

Figure 2:
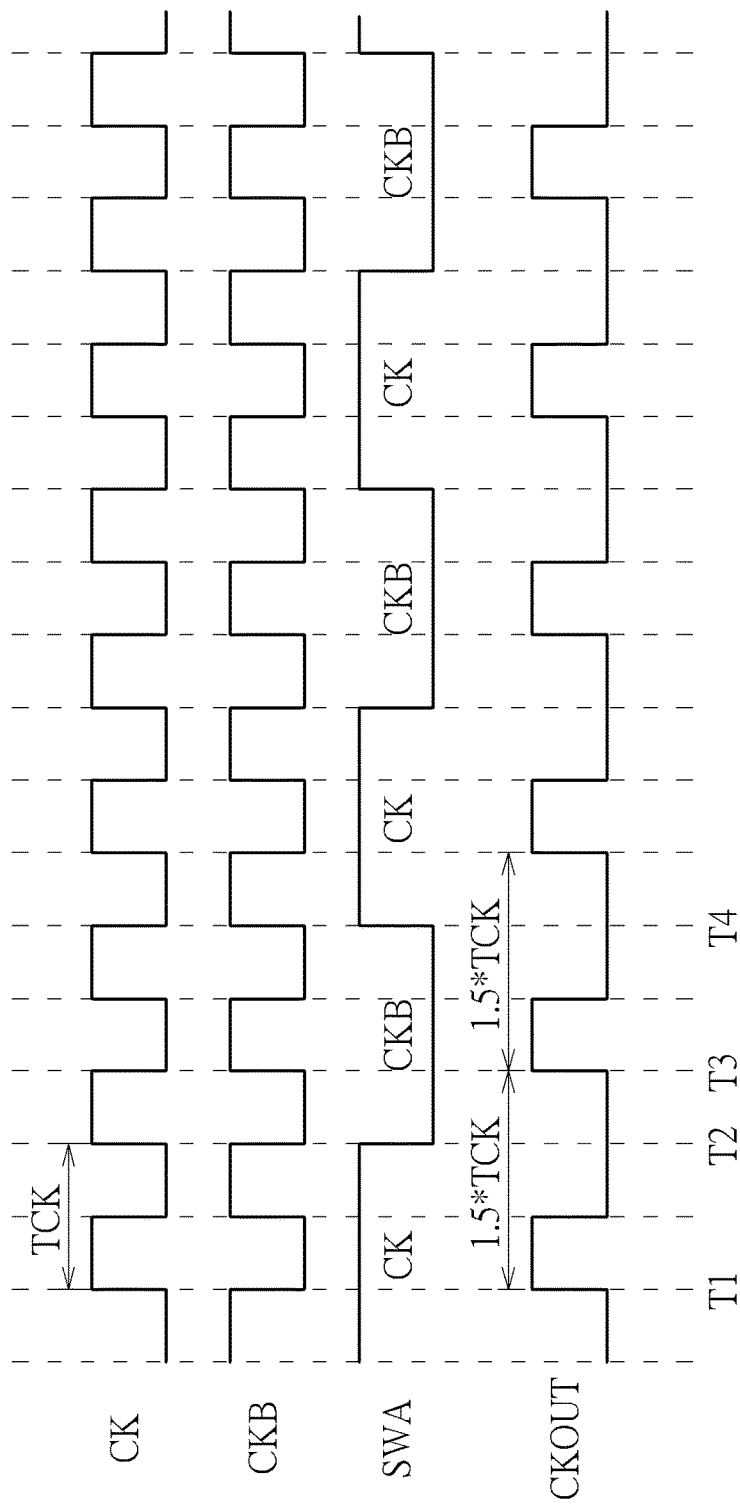
FIG. 2 illustrates a schematic diagram of related signals of the fractional dividing module shown in FIG. 1.

As to the detailed operations of the fractional dividing module 10 shown in FIG. 1, please refer to FIG. 2. FIG. 2 illustrates a schematic diagram of related signals of the fractional dividing module 10 shown in FIG. 1. Because the selecting control signal SWB is the inverse signal of the selecting control signal SWA, FIG. 2 presents the selecting control signal SWA for illustrations. In this example, the dividing control signal DIV_CTRL is set to indicate the fractional divisor 1.5. At a time T1, the fractional dividing module 10 begins to operate. The selecting control signal SWA is "0" and the selecting unit SEL outputs the input clock signal CK as the output clock signal CKOUT. At a time T2, the control circuit CON receives the second rising edge of the output clock signal CKOUT after the time T1 and switches the selecting control signal SWA to "0". The selecting unit SEL changes to output the delayed input clock signal CKB as the output clock signal CKOUT. In such a condition, the first period of the output clock signal CKOUT (e.g. the period from the times T1 to T3) becomes the period TCK of the input clock signal CK plus half of the period TCK (i.e. 1.5*TCK).

At a time T4, the control circuit CON receives the second rising edge of the output clock signal CKOUT after the time T2 and switches the selecting control signal SWA to "1". The selecting unit SEL changes to output the input clock signal CK as the output clock signal CKOUT, and so on. As can be seen from FIG. 2, the second period of the output clock signal CKOUT is also equal to 1.5*TCK. In other words, the frequency of output clock signal CKOUT is acquired by dividing the frequency of the input clock signal CK by 1.5.

In FIG. 1, the control circuit CON comprises a D-flip-flop DFF, an AND gate and a timing control circuit TCC. The D-flip-flop DFF comprises a clock terminal CK for receiving the output clock signal CKOUT, an output terminal Q for outputting the selecting control signal SW, an inverse output terminal Qb for outputting an inverse selecting control signal SW' of the selecting control signal SW and a data terminal D. The AND gate comprises a first input terminal for receiving the inverse selecting control signal SW', a second input terminal for receiving the dividing control signal DIV_CTRL and an output terminal coupled to the data terminal D of the D-flip-flop DFF. The timing control circuit TCC is coupled to the output terminal Q for generating the selecting control signals SWA and SWB according to the selecting control signal SW. In an example, the selecting control signal SWA is the inverse selecting control signal SW' and the selecting control signal SWB is the inverse selecting control signal SW. Note that, The timing control circuit TCC separates the rising edges or falling edges of the selecting control signals SWA and SWB, to make the selecting control signals SWA and SWB to be non-overlapped signals. If the selecting control signals SW and SW' are non-overlapped, the timing control circuit may be omitted. According to the non-overlapped selecting control signals SWA and SWB, the fractional dividing module 10 avoids generating glitches when the selecting control signals SW is switched. According to different design concepts, the control circuit CON can be realized by various methods as long as the selecting control signals SWA and SWB are generated via dividing the output clock signal CKOUT by 2.

Figure 3:
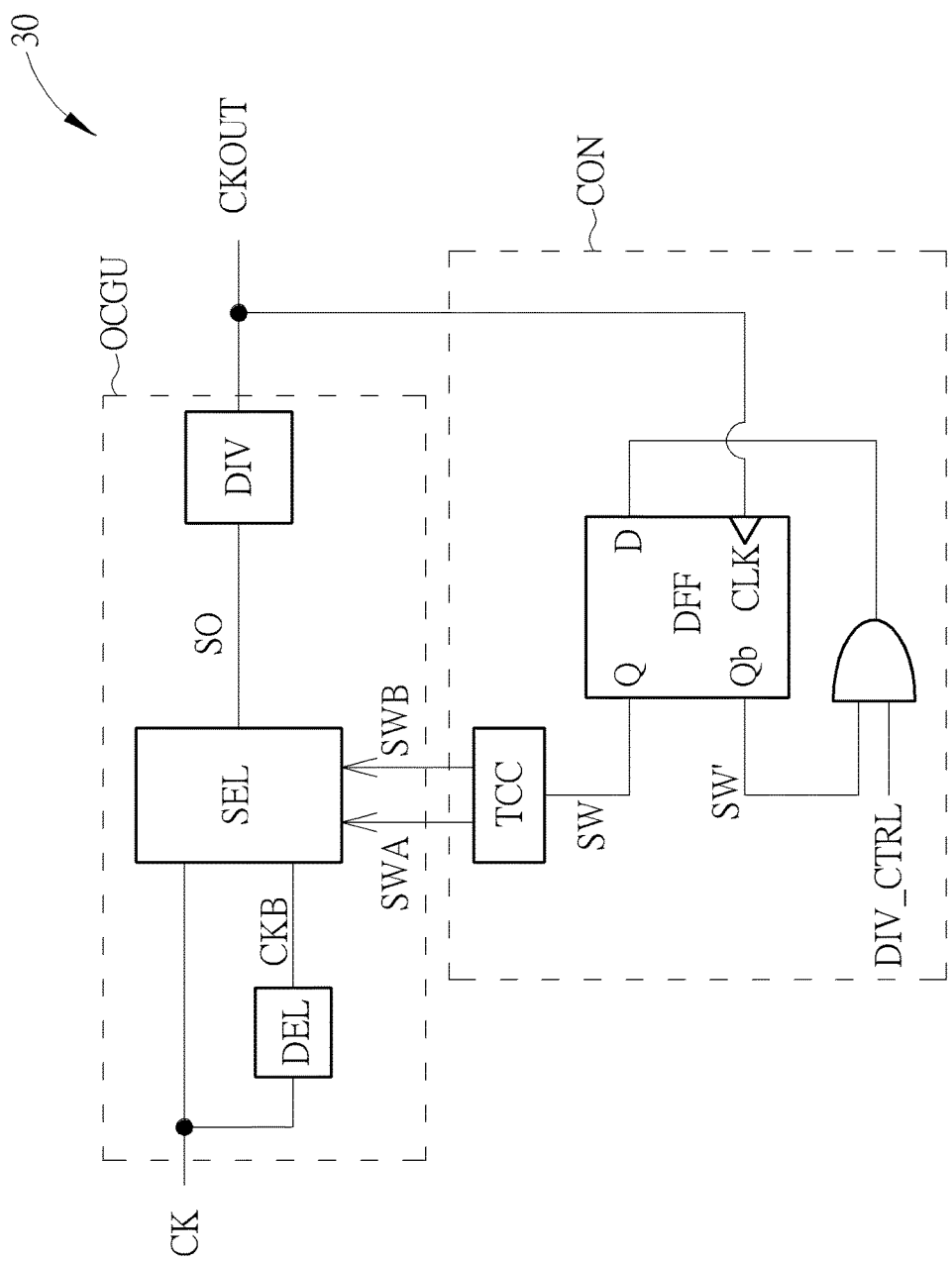
FIG. 3 is a schematic diagram of a fractional dividing module according to an example of the present invention.

Please refer to FIG. 3, which is a schematic diagram of a fractional dividing module 30 according to an example of the present invention. The fractional dividing module 30 is similar to the fractional dividing module 10 shown in FIG. 1, thus the signals and the components with the similar functions use the same symbols. In comparison with the fractional dividing module 10 shown in FIG. 1, the output clock generating circuit OCGC further comprises a dividing unit DIV providing a divisor X, wherein X is a rational number. The selecting unit SEL outputs one of the input clock signal CK and the delayed input clock signal CKB as a selecting output signal SO according to the selecting control signals SWA and SWB and to the dividing unit DIV and then the dividing unit DIV generates the output clock signal CKOUT by dividing the selecting output signal SO by the divisor X. In this example, the control circuit CON generates the selecting control signals SWA and SWB according to the dividing control signal DIV_CTRL (i.e. the divisor of the fractional dividing module 30) and the output clock signal CKOUT generated by the dividing unit DIV. After adding the dividing unit DIV, the divisor provided by the fractional dividing module 30 becomes X or (X+0.5).

Figure 4:
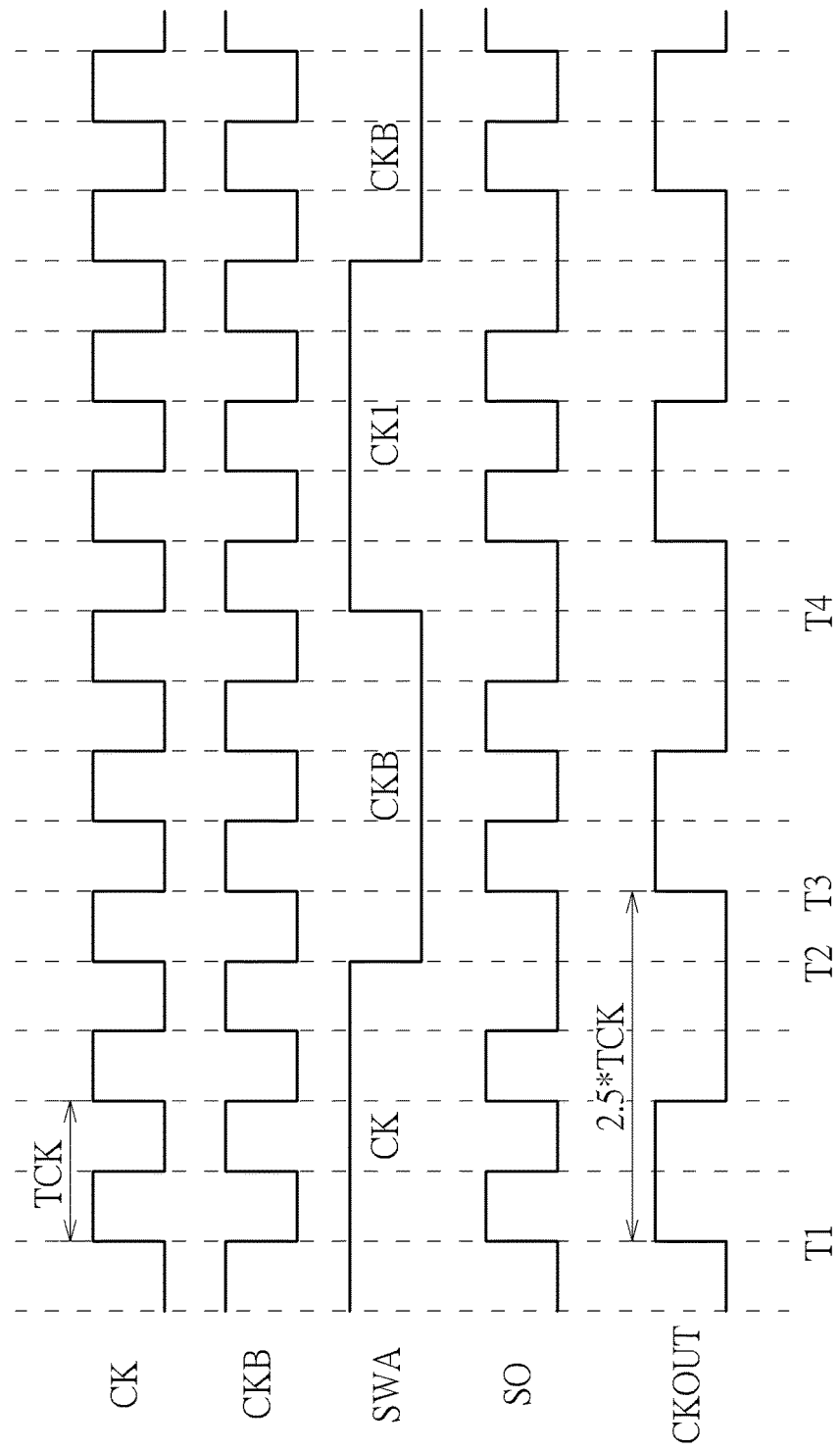
FIG. 4 illustrates a schematic diagram of related signals of the fractional dividing module shown in FIG. 3.

Please refer to FIG. 4, which illustrates a schematic diagram of related signals of the fractional dividing module 30 shown in FIG. 3. Because the selecting control signal SWB is the inverse signal of the selecting control signal SWA, FIG. 4 presents the selecting control signal SWA for illustrations. In this example, the divisor X is 2 and the dividing control signal DIV_CTRL is set to indicate the fractional divisor 2.5 (e.g. the dividing control signal DIV_CTRL is "1"). At the time T1, the fractional dividing module 30 begins to operate. The selecting control signal SWA is "1", the selecting unit SEL outputs the input clock signal CK as the selecting output signal SO, and the dividing unit DIV switches the output clock signal CKOUT at the rising edges of the selecting output signal SO. At the time T2, the control circuit CON receives second rising edge of the output clock signal CKOUT after the time T1 and switches the selecting control signal SWA. In such a condition, the selecting unit SEL outputs the delayed input clock signal CKB as the selecting output signal SO at the time T2. Note that, the dividing unit DIV does not switch the output clock signal CKOUT at the time T2 because the selecting control signal SWA is switched. The dividing unit DIV changes to switch the output clock signal CKOUT at the rising edges of the delayed input clock signal CKB (e.g. the time T3). The first period of the output clock signal CKOUT (e.g. the period from the times T1 to T3) becomes 2 times the period TCK and plus half of the period TCK (i.e. 2.5*TCK).

Next, the control circuit CON receives second rising edge of the output clock signal CKOUT after the time T2 and switches the selecting control signal SWA at the time T4. In such a condition, the selecting unit SEL outputs the input clock signal CK as the selecting output signal SO, the dividing unit DIV changes to switch the output clock signal CKOUT at the rising edges of the input clock signal CK, and so on. As can be seen from FIG. 4, the period of the output clock signal CKOUT becomes the 2.5*TCK.

Figure 5:
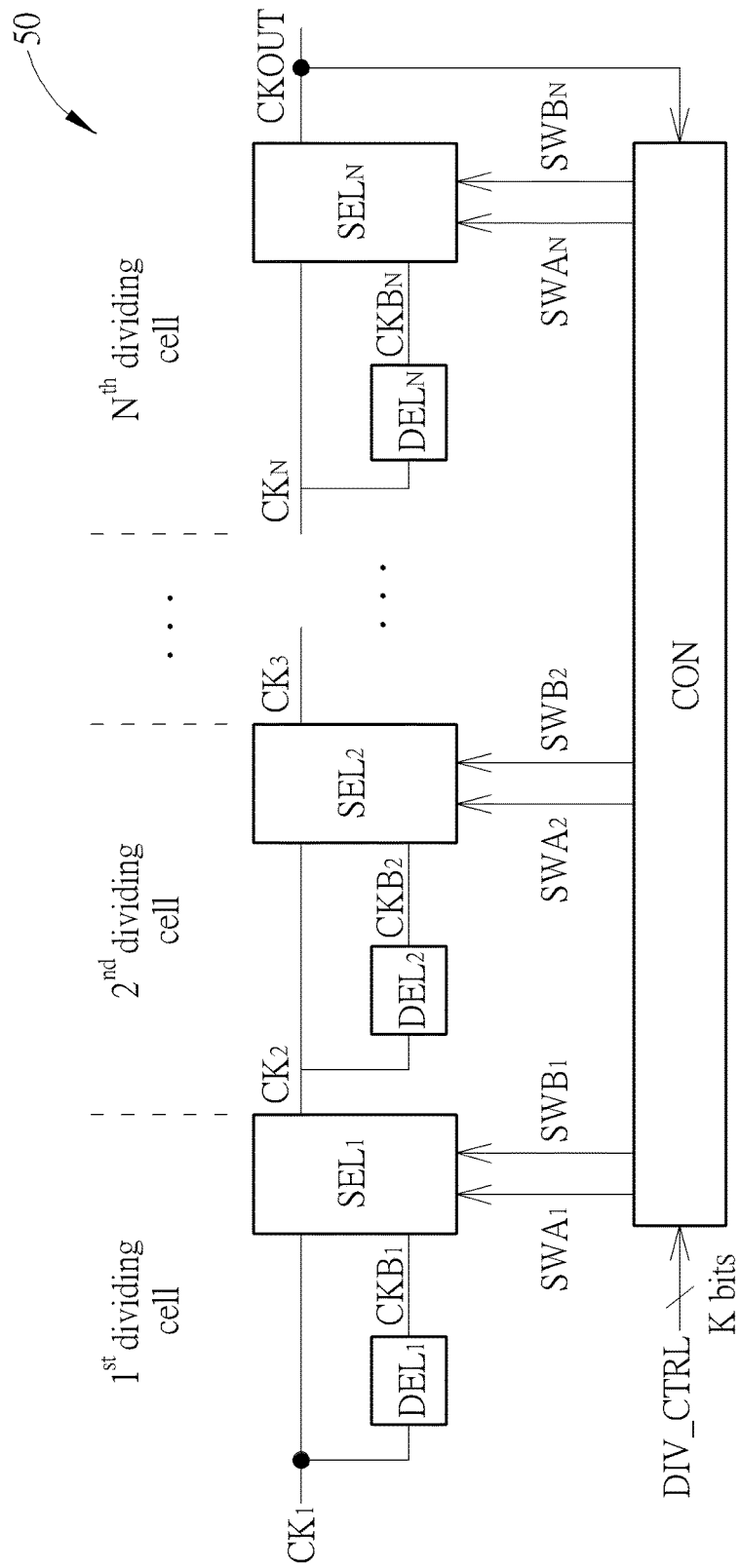
FIG. 5 is a schematic diagram of a fractional dividing module according to an example of the present invention.

In an example, a fractional dividing module can be realized by a plurality of dividing cells, wherein each dividing cell is composed of the delay unit DEL and the selecting unit SEL shown in FIG. 1 (i.e. the output clock generating circuit OCGC). Please refer to FIG. 5, which illustrates the fractional dividing module 50 according to an example of the present invention. The fractional dividing module 50 may be a frequency divider in an integrated circuit, and is not limited herein. As shown in FIG. 5, the fractional dividing module 50 comprises N dividing cells and each of dividing cells comprises a selecting unit and a delay unit, wherein N is a positive integer. In the $i^{th}$ dividing cell among the N dividing cells, the delay unit $DEL_i$ delays an input clock signal $CK_i$ $0.5^i$ of the period of the input clock signal $CK_1$ to generate a delayed input clock signal $CKB_i$ and the selecting unit $SEL_i$ outputs one of the input clock signal $CK_i$ and the delayed input clock signal $CKB_i$ according to the selecting control signal $SWA_1$ and $SWB_1$. The control circuit CON may be an N-bits accumulator and is utilized for generating the selecting control signals $SWA_1$-$SWA_N$ and $SWB_1$-$SWB_N$ according to the output clock signal CKOUT and the dividing control signal DIV_CTRL. By adjusting the selecting control signals $SWA_1$-$SWA_N$ and $SWB_1$-$SWB_N$ according to the output clock signal CKOUT and the dividing control signal DIV_CTRL, the fractional dividing module 50 provides divide-by-$(1+0.5^m)$ function, wherein m is an positive integer not bigger than N (i.e. 0<m≤N). In other words, the ratio between the frequency of the input clock signal $CK_1$ and that of the output clock signal CKOUT can be 1 or $1+0.5^m$, wherein 0<m≤N.

In detail, the control circuit CON adjusts the selecting control signals $SWA_1$-$SWA_N$ and $SWB_1$-$SWB_N$ according the output clock signal CKOUT and the dividing control signal DIV_CTRL, wherein the dividing control signal DIV_CTRL is a K bits signal and the number K is proportional to the number of divisor provided by the fractional dividing module 50. When the dividing control signal DIV_CTRL indicates the divisor of the fractional dividing module 50 is 1, the control circuit CON adjusts the selecting control signals $SWA_1$-$SWA_N$ and $SWB_1$-$SWB_N$ to make the selecting units $SEL_1$-$SEL_N$ output the input clock signals $CK_1$-$CK_N$ (i.e. CKOUT=$CK_1$), respectively.

When the dividing control signal DIV_CTRL indicates the divisor of the fractional dividing module 50 is $1+0.5^m$, wherein m is a positive integer smaller than or equal to N, the control circuit CON adjusts the selecting control signals $SWA_1$-$SWA_m$ and $SWB_1$-$SWB_m$ according the output clock signal CKOUT and adjusts the $SWA_{m+1}$-$SWA_N$ and $SWB_{m+1}$-$SWB_N$ to control the selecting units $SEL_{m+1}$-$SEL_N$ to output the input clock signals $CK_{m+1}$-$CK_N$, respectively. The selecting control signal $SWA_1$ is generated by dividing the output clock signal by $2^m$, the selecting control signal $SWA_2$ is generated by dividing the output clock signal by $2^{m-1}$, and so on. In other words, the control circuit CON generates the $i^{th}$ selecting control signal by dividing the output clock signal by $2^{(m-i+1)}$ when 0<i≤m and maintains the $i^{th}$ selecting control signal to control the selecting unit $SEL_i$ of the $i^{th}$ dividing cell to output the input clock signal $CK_i$ when m<i≤N. Under such a condition, the period of the output clock signal CKOUT would be the period TCK of the input clock signals CK1 plus $0.5^m$ of the period TCK (i.e. $(1+0.5^m)*TCK$. That is, the fractional dividing module 50 divides the input clock signal CK1 by $1+0.5^m$ to generate the output clock signal CKOUT.

Note that, the fractional dividing module 10 is an example of the fractional dividing module 50 when N is 1.

Figure 6:
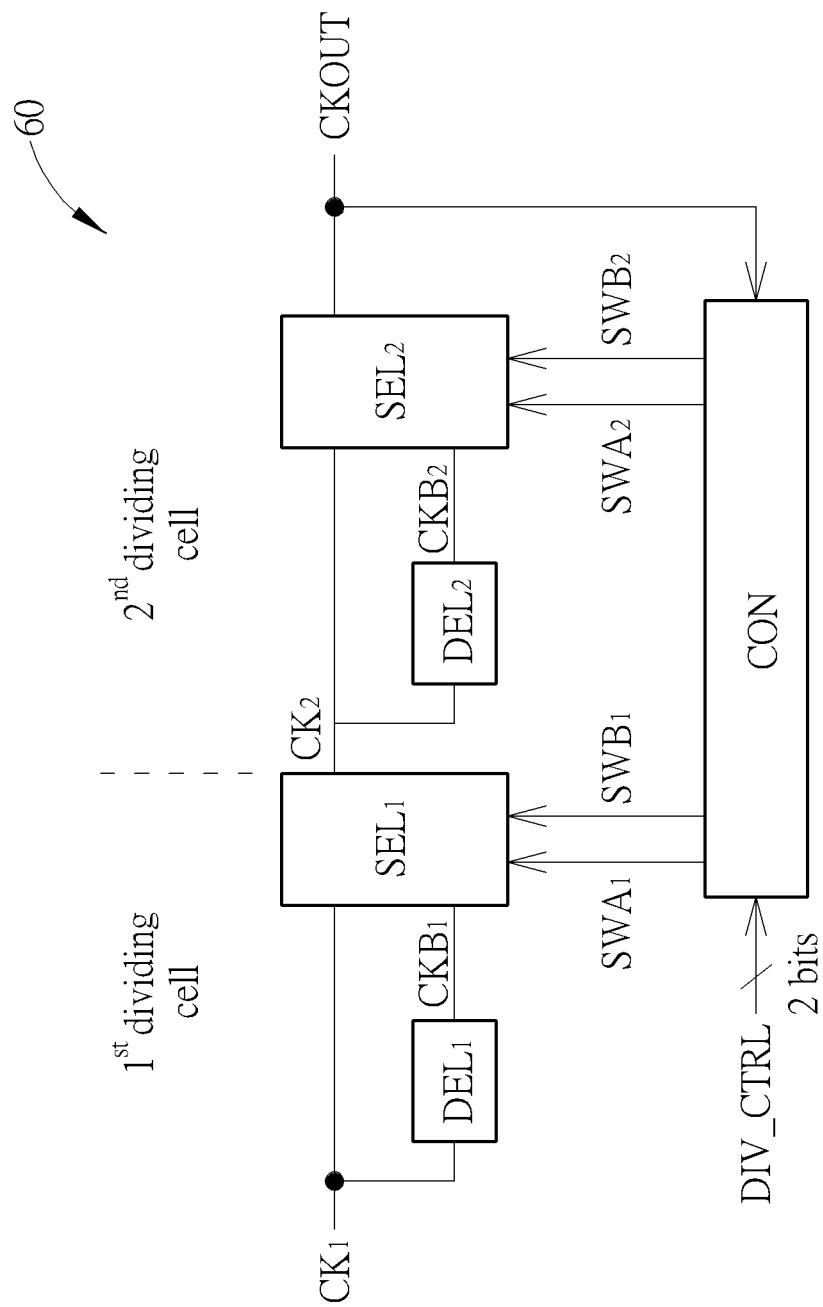
FIG. 6 is a schematic diagram of a fractional dividing module according to an example of the present invention.

Please refer to FIG. 6, which is a schematic diagram of a fractional dividing module 60 according to an example of the present invention. The fractional dividing module 60 may be a feedback divider in a PLL based frequency synthesizer, and is not limited herein. As shown in FIG. 6, the fractional dividing module 60 comprises a $1^{st}$ dividing cell composed of a delay unit $DEL_1$ and a selecting unit $SEL_1$; a $2^{nd}$ dividing cell composed of a delay unit $DEL_2$ and a selecting unit $SEL_2$; and a control circuit CON. Note that, the fractional dividing module 60 is an example of the fractional dividing module 50 shown in FIG. 5 when N is 2. The $1^{st}$ dividing cell outputs one of input clock signal $CK_1$ and the delayed input clock signal $CKB_1$ as an input clock signal $CK_2$ of the $2^{nd}$ dividing cell according to the selecting control signals $SWA_1$ and $SWB_1$, wherein the phase difference between the input clock signal $CK_1$ and the delayed input clock signal $CKB_1$ (i.e. generated by the delay unit $DEL_1$) is half ($2^{-1}$) of the period TCK of the input clock signal $CK_1$. Similarly, the $2^{nd}$ dividing cell outputs one of input clock signal $CK_2$ and the delayed input clock signal $CKB_2$ as an output clock signal CKOUT according to the selecting control signals $SWA_2$ and $SWB_2$, wherein the phase difference between the input clock signal $CK_2$ and the delayed input clock signal $CKB_2$ is quarter ($2^{-2}$) of the period TCK of the input clock signal $CK_1$. The control circuit CON may be a 2-bits accumulator and is utilized for generating the selecting control signal $SWA_1$, $SWB_1$, $SWA_2$, and $SWB_2$. By adjusting the selecting control signals $SWA_1$, $SWB_1$, $SWA_2$, and $SWB_2$, the divisor provided by the fractional dividing module 60 (i.e. the frequency ratio between the output clock signal CKOUT and the input clock signal $CK_1$) can be 1 or $1+0.5^m$, wherein m is 2 or 1. That is, the fractional dividing module 60 provides the divide-by-1.5 and the divide-by-1.25 functions.

In details, the control circuit CON maintains the selecting control signals $SWA_1$ and $SWA_2$ to "1" and the selecting control signals $SWB_1$ and $SWB_2$ to "0" when the dividing control signal DIV_CTRL indicates the divisor of the fractional dividing module 60 is 1, to make the selecting unit $SEL_L$ output the input clock signal $CK_1$ as the input clock signal $CK_2$ and make the selecting unit $SEL_2$ output the input clock signal $CK_2$ as the output clock signal CKOUT (i.e. CKOUT=$CK_1$).

When the dividing control signal DIV_CTRL indicates the divisor of the fractional dividing module 60 is 1.5, the control circuit CON generates the selecting control signals $SWA_1$ and $SWB_1$ via dividing the output clock signal CKOUT by 2 and keeps the selecting control signals $SWA_2$ and $SWB_2$ respectively at "1" and "0". For example, the control circuit CON switches the selecting control signals $SWA_1$ and $SWB_1$ when detecting 2 contiguous rising edges of the output clock signal CKOUT. In such a condition, the operation principles of the fractional dividing module 60 are similar to those of the fractional dividing module 10 and the period of the output clock signal CKOUT becomes 1.5 times the period TCK.

When the dividing control signal DIV_CTRL indicates the divisor of the fractional dividing module 60 is 1.25, the control circuit CON generates the selecting control signals $SWA_1$ and $SWB_1$ via dividing the output clock signal CKOUT by $2^2=4$ and generates the selecting control signals $SWA_2$ and $SWB_2$ via dividing the output clock signal CKOUT by $2^1=2$. For example, the control unit CON switches the selecting control signal $SWA_1$ when detecting 4 contiguous rising edges of the output clock signal CKOUT and switches the selecting control signal $SWA_2$ when detecting 2 contiguous rising edges of the output clock signal CKOUT. In such a condition, the period of the output clock signal CKOUT becomes 1.25 times the period TCK.

Figure 7:
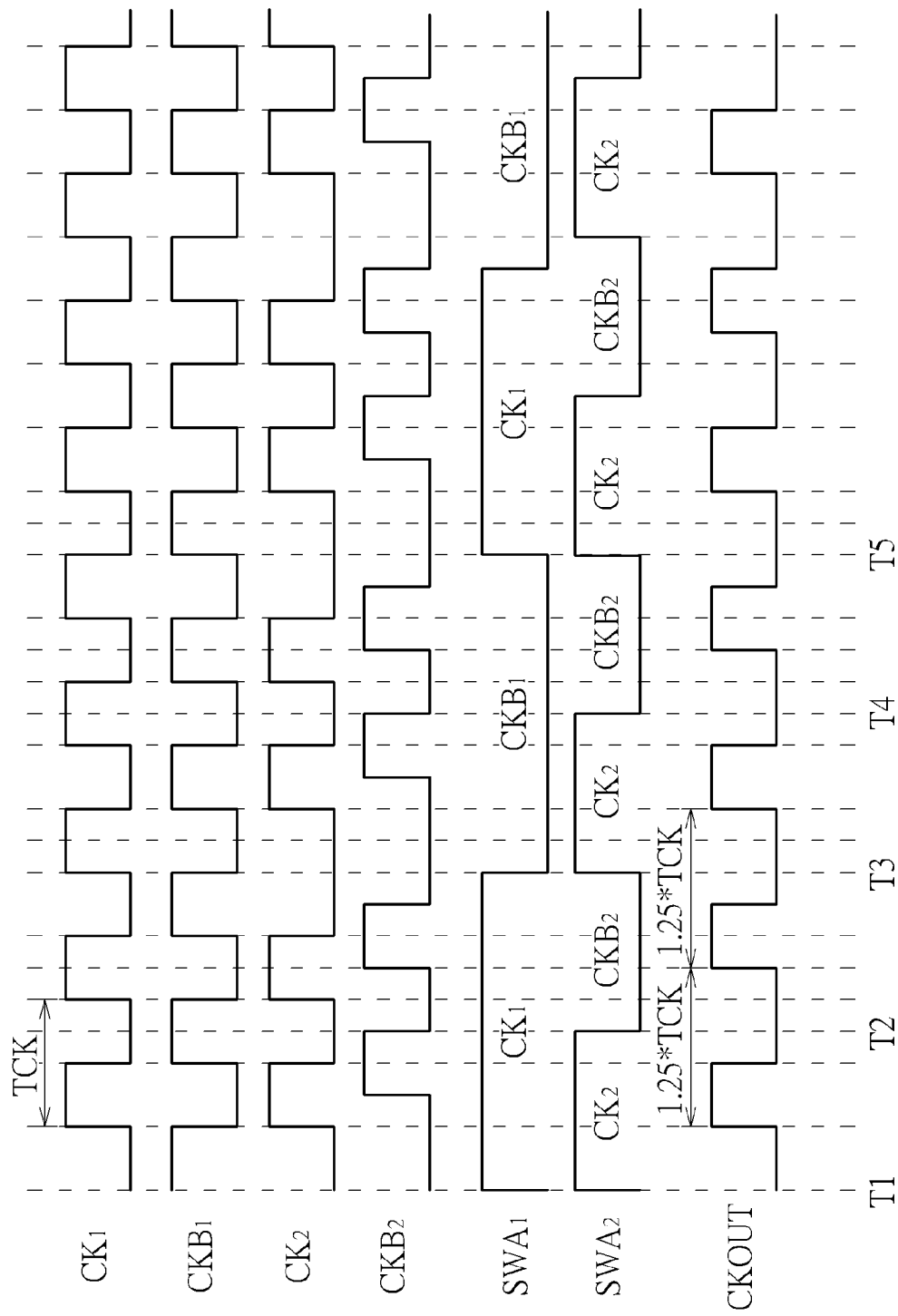
FIG. 7 illustrates a schematic diagram of related signals of the fractional dividing module shown in FIG. 6.

As to the detailed operations of the fractional dividing module 60 shown in FIG. 6, please refer to FIG. 7. FIG. 7 illustrates a schematic diagram of related signals when the fractional dividing module 60 shown in FIG. 6 operates. In addition, FIG. 7 presents the selecting control signals $SWA_1$ and $SWA_2$ for illustrations because the selecting control signals $SWB_1$ and $SWB_2$ are inverse signals of the selecting control signals $SWA_1$ and $SWA_2$. Since the operation of the fractional dividing module 60 is similar to that of the fractional dividing module 10 shown in FIG. 1 when the divisor is 1 and 1.5, FIG. 7 illustrates the example of that the dividing control signal DIV_CTRL indicates the divisor 1.25. Under such a condition, the period of the selection control signals $SWA_1$ is 4 times the period of the output clock signal CKOUT and the period of the selection control signals $SWA_2$ is 2 times the period of the output clock signal CKOUT. At time T1, the fractional dividing module 60 begins to operate. The selecting control signals $SWA_1$ and $SWA_2$ are "1", the selecting unit $SEL_1$ outputs the input clock signal $CK_1$ as the input clock signal $CK_2$ and the selecting unit $SEL_2$ outputs the input clock signal $CK_2$ as the output clock signal CKOUT. At time T2, the control circuit CON switches the selecting control signal $SWA_2$ to "1". The selecting unit $SEL_2$ changes to output the delayed input clock signal $CKB_2$ as the output clock signal CKOUT. In such a condition, the first period of the output clock signal CKOUT becomes the period TCK of the input clock signal $CK_1$ plus quarter of the period TCK (i.e. 1.25*TCK).

At the time T3, the control circuit CON switches the selecting signal $SWA_1$ to "0" and switches the selecting control signal $SWA_2$ to "1". The selecting unit $SEL_1$ changes to output the input clock signal $CKB_1$ as the input clock signal $CK_2$, and the selecting unit $SEL_2$ changes to output the input clock signal $CK_2$ as the output clock signal CKOUT. The second period of the output clock signal CKOUT also equals 1.25*TCK.

At the time T4, the control circuit CON switches the selecting control signal $SWA_2$ to "0". The selecting unit $SEL_2$ changes to output the delayed input clock signal $CKB_2$ as the output clock signal CKOUT. The third period of the output clock signal CKOUT is equal to the period TCK of the input clock signal $CK_1$ plus quarter of the period TCK.

At the time T5, the control circuit CON switches the selecting signal $SWA_1$ to "0" and switches the selecting control signal $SWA_2$ to "1". The selecting unit SEL1 changes to output the input clock signal $CKB_1$ as the input clock signal $CK_2$, and the selecting unit $SEL_2$ changes to output the input clock signal $CK_2$ as the output clock signal CKOUT. Via repeating the abovementioned processes of adjusting the selecting control signals $SWA_1$ and $SWA_2$ according to the output clock signal CKOUT, the period of the output clock signal CKOUT is adjusted to the period TCK of the input clock signal $CK_1$ times 1.25. In other words, the fractional dividing module 60 realizes the function of divide-by-1.25.

Figure 8:
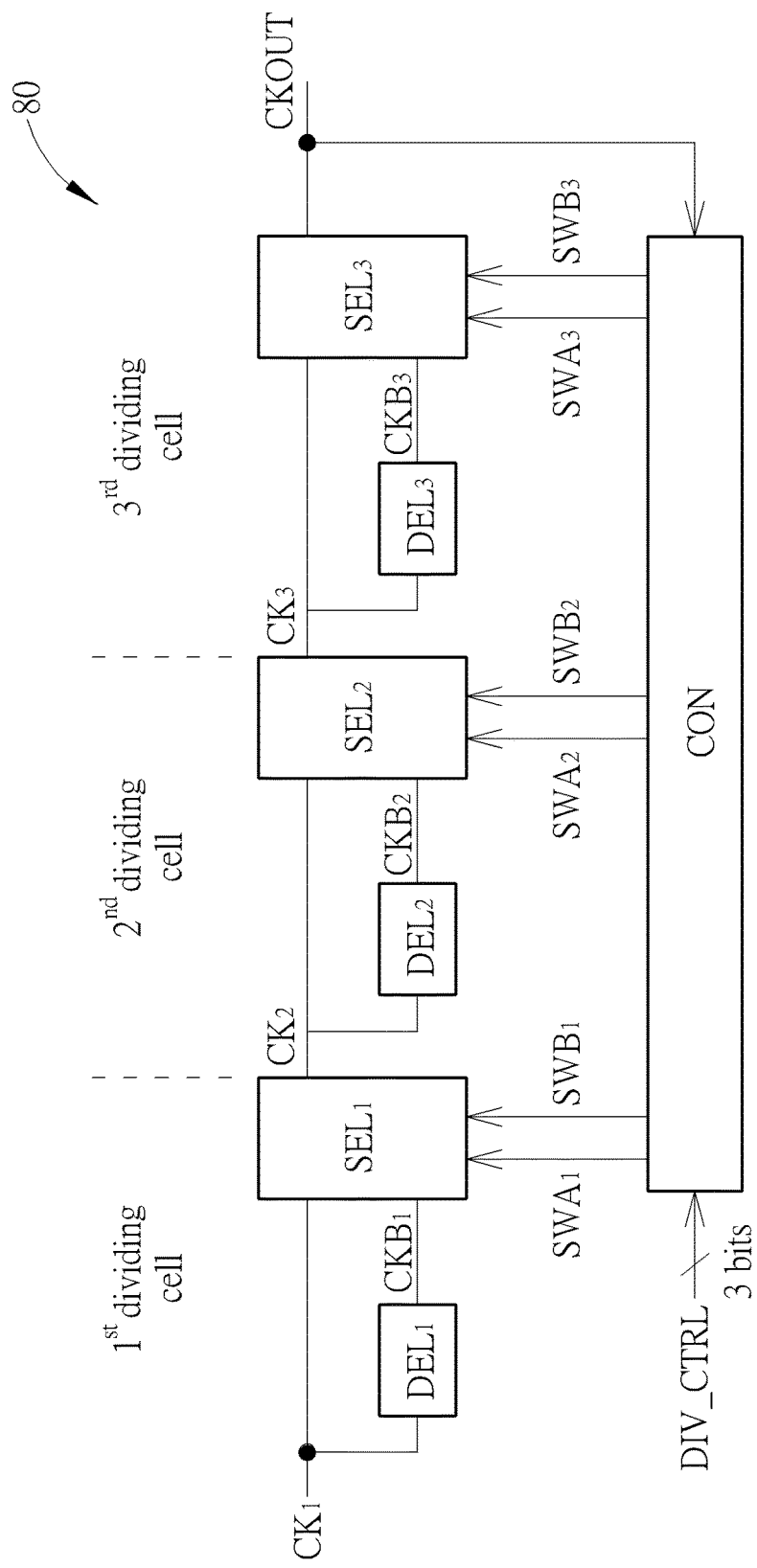
FIG. 8 is a schematic diagram of a fractional dividing module according to an example of the present invention.

Please refer to FIG. 8, which is a schematic diagram of a fractional dividing module 80 according to an example of the present invention. The fractional dividing module 80 may be a feedback divider in a PLL based frequency synthesizer, and is not limited herein. As shown in FIG. 8, the fractional dividing module 80 comprises a $1^{st}$ dividing cell composed of a delay unit $DEL_1$ and a selecting unit $SEL_1$; a $2^{nd}$ dividing cell composed of a delay unit $DEL_2$ and a selecting unit $SEL_2$; a $3^{rd}$ dividing cell composed of a delay unit $DEL_3$ and a selecting unit $SEL_3$; and a control circuit CON. The $1^{st}$ dividing cell outputs one of input clock signal $CK_1$ and the delayed input signal $CKB_1$ as an input clock signal $CK_2$ of the $2^{nd}$ dividing cell according to the selecting control signals $SWA_1$ and $SWB_1$, wherein the phase difference between the input clock signal $CK_1$ and the delayed input signal $CKB_1$ is half ($2^{-1}$) of the period TCK of the input clock signal $CK_1$. Similarly, the $2^{nd}$ dividing cell outputs one of input clock signal $CK_2$ and the delayed input signal $CKB_2$ as an input clock signal $CK_3$ of the $3^{rd}$ dividing cell according to the selecting control signals $SWA_2$ and $SWB_2$, wherein the phase difference between the input clock signal $CK_2$ and the delayed input signal $CKB_2$ is quarter ($2^{-2}$) of the period TCK of the input clock signal $CK_1$. The $3^{rd}$ dividing cell outputs one of input clock signal $CK_3$ and the delayed input signal $CKB_3$ as an output clock signal CKOUT according to the selecting control signals $SWA_3$ and $SWB_3$, wherein the phase difference between the input clock signal $CK_3$ and the delayed input signal $CKB_3$ is one-eighth ($2^{-3}$) of the period TCK of the input clock signal $CK_1$. The control circuit CON may be a 3-bits accumulator and is utilized for adjusting the selecting control signals $SWA_1$-$SWA_3$ and $SWB_1$-$SWB_3$ according to the dividing control signal DIV_CTRL and the output clock signal CKOUT. By adjusting the selecting control signals $SWA_1$-$SWA_3$, the frequency ratio between the output clock signal CKOUT and the input clock signal $CK_1$ can be 1, 1.5, 1.25 and 1.125 (i.e. $1+0.5^m$, m=1, 2 or 3).

In details, the control circuit CON maintains the selecting control signals $SWA_1$-$SWA_3$ to "1" and $SWB_1$-$SWB_3$ to "0" when the dividing control signal DIV_CTRL indicates the divisor of the fractional dividing module 80 is 1, to make the selecting unit $SEL_1$ output the input clock signal $CK_1$ as the input clock signal $CK_2$, make the selecting unit $SEL_2$ output the input clock signal $CK_2$ as the input clock signal $CK_3$, and make the selecting unit $SEL_3$ to output the input clock signal $CK_3$ as the output clock signal CKOUT (i.e. CKOUT=$CK_1$).

When the dividing control signal DIV_CTRL indicates the divisor of the fractional dividing module 80 is 1.5, the control circuit CON generates the selecting control signals $SWA_1$ and $SWB_2$ via dividing the output clock signal CKOUT by 2 and keeps the selecting control signals $SWA_2$ and $SWA_3$ at "1" and $SWB_2$ and $SWB_3$ at "0". In such a condition, the operation principles of the fractional dividing module 80 are similar to those of the fractional dividing module 10 and the period of the output clock signal CKOUT becomes 1.5 times the period TCK.

When the dividing control signal DIV_CTRL indicates the divisor of the fractional dividing module 80 is 1.25, the control circuit CON generates the selecting control signals $SWA_1$ and $SWB_1$ via dividing the output clock signal CKOUT by $2^2$=4, generates the selecting control signals $SWA_2$ and $SWB_2$ via dividing the output clock signal CKOUT by $2^1$=2 and keeps the selecting control signals $SWA_3$ and $SWB_3$ respectively at "1" and "0". The operation principles of the fractional dividing module 80 are similar to those of the fractional dividing module 60 and the period of the output clock signal CKOUT becomes 1.25 times the period TCK.

When the dividing control signal DIV_CTRL indicates the divisor of the fractional dividing module 80 is 1.125, the control circuit CON generates the selecting control signal $SWA_1$ via dividing the output clock signal CKOUT by $2^3$=8, generates the selecting control signal $SWA_2$ via dividing the output clock signal CKOUT by $2^2$=4 and generates the selecting control signal $SWA_3$ via dividing the output clock signal CKOUT by $2^1$=2. Under such a condition, the period of the output clock signal CKOUT becomes 1.125 times the period TCK.

Figure 9:
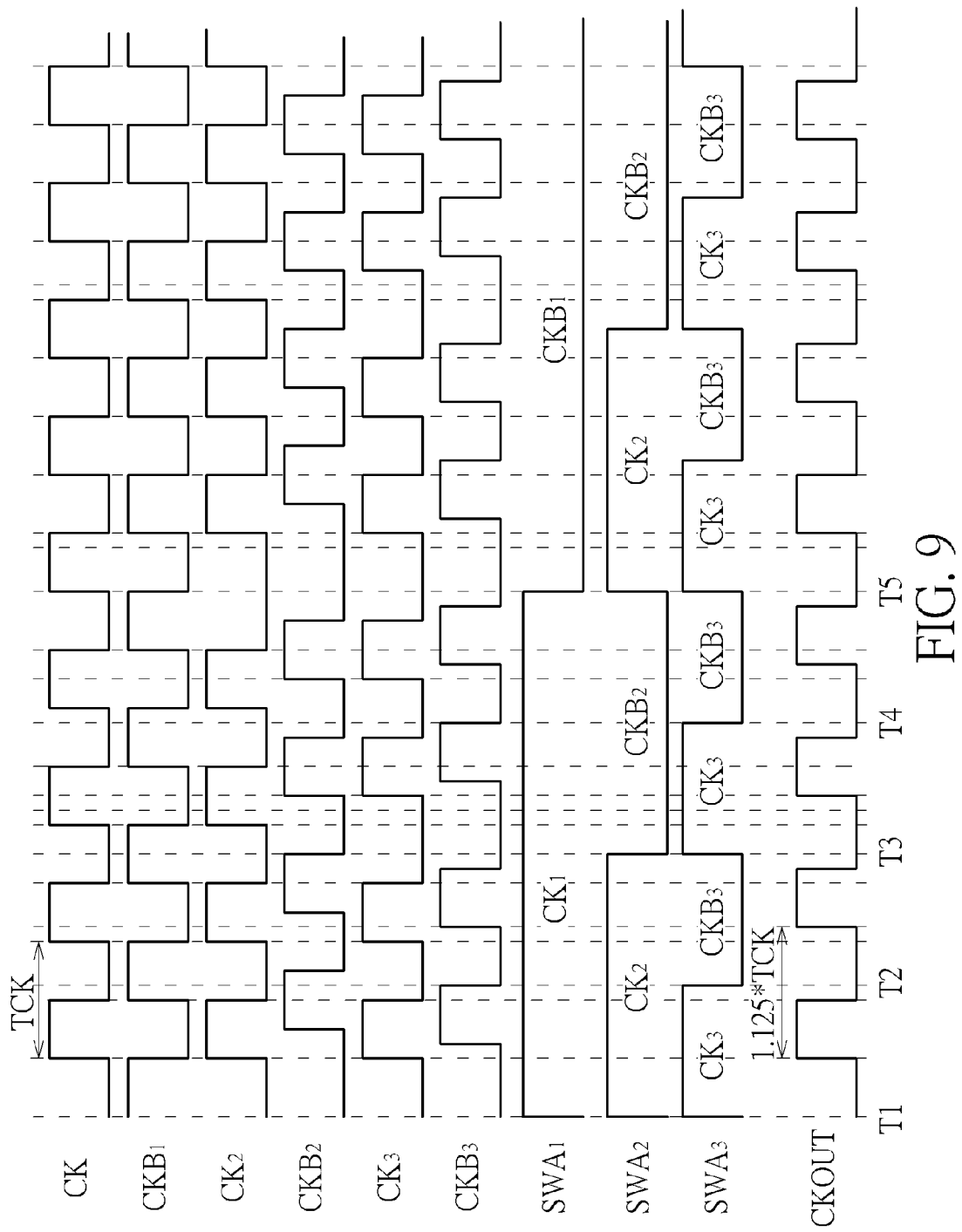
FIG. 9 illustrates a schematic diagram of related signals of the fractional dividing module shown in FIG. 8.

As to the detailed operations of the fractional dividing module 80 shown in FIG. 8, please refer to FIG. 9. FIG. 9 illustrates a schematic diagram of related signals when the fractional dividing module 80 shown in FIG. 8 operates. The operation principles of the fractional dividing module 80 when the divisor is 1, 1.5 and 1.25 can be referred to the above descriptions of the fractional dividing modules 10 and 60, and are not narrated herein for brevity. In addition, FIG. 9 presents the selecting control signals $SWA_1$, $SWA_2$, and $SWA_3$ for illustrations because the selecting control signals $SWB_1$, $SWB_2$, and $SWB_3$ are inverse signals of the selecting control signals $SWA_1$, $SWA_2$, and $SWA_3$. In FIG. 9, the dividing control signal DIV_CTRL indicates the fractional dividing module 80 to achieve the function of divide-by-1.125. Under such a condition, the period of the selection control signal $SWA_1$ is 8 times the period of the output clock signal CKOUT, the period of the selection control signal $SWA_2$ is 4 times the period of the output clock signal CKOUT, and the period of the selection control signal $SWA_3$ is 2 times the period of the output clock signal CKOUT.

At the time T1, the fractional dividing module 80 begins to operate. The selecting control signals $SWA_1$-$SWA_3$ are "1", the selecting unit $SEL_1$ outputs the input clock signal $CK_1$ as the input clock signal $CK_2$, the selecting unit $SEL_2$ outputs the input clock signal $CK_2$ as the input clock signal $CK_3$ and the selecting unit $SEL_3$ outputs the input clock signal $CK_3$ as the output clock signal CKOUT. At the time T2, the control circuit CON switches the selecting control signal $SWA_3$ to "1" and the selecting unit $SEL_3$ changes to output the delayed input clock signal $CKB_3$ as the output clock signal CKOUT. Since the phase difference between the clock signal $CK_3$ and the delayed input clock signal $CKB_3$ is one-eighth of the period TCK, the first period of the output clock signal CKOUT becomes the period TCK plus one-eighth of the period TCK (i.e. 1.125*TCK).

At the time T3, the control circuit CON switches the selecting control signal $SWA_2$ to "1" and switches the selecting control signal $SWA_3$ to "0". The selecting unit $SEL_2$ changes to output the delayed input clock signal $CKB_2$ as the input clock signal $CK_3$ and the selecting unit $SEL_3$ changes to output the input clock signal $CK_3$ as the output clock signal CKOUT. Since the phase difference generated from switching the input clock signal $CK_2$ to the delayed input clock signal $CKB_2$ is 0.25*TCK and the phase difference generated from switching the input clock signal $CKB_3$ to the input clock signal $CK_3$ is −0.125*TCK, the second period of the output clock signal CKOUT is kept at 1.125*TCK.

At the time T4, the control circuit CON switches the selecting control signal $SWA_3$ to "0" and the selecting unit $SEL_3$ changes to output the delayed input clock signal $CKB_3$ as the output clock signal CKOUT. Since the phase difference between the clock signals $CK_3$ and $CKB_3$ is one-eighth of the period TCK, the third period of the output clock signal CKOUT becomes 1.125*TCK.

At the time T5, the control circuit CON switches the selecting control signal $SWA_1$ to "0" and switches the selecting control signals $SWA_2$ and $SWA_3$ to "1". The selecting unit $SEL_1$ changes to output the delayed input clock signal $CKB_1$ as the input clock signal $CK_2$, the selecting unit SEL2 changes to output the input clock signal $CK_2$ as the input clock signal $CK_3$ and the selecting unit $SEL_3$ changes to output the input clock signal $CK_3$ as the output clock signal CKOUT. Since the phase difference generated from switching the input clock signal $CK_1$ to the input clock signal $CKB_1$ is 0.5*TCK, the phase difference generated from switching the input clock signal $CKB_2$ to the input clock signal $CK_2$ is −0.25*TCK and the phase difference generated from switching the input clock signal $CKB_3$ to the input clock signal $CK_3$ is −0.125*TCK, the fourth period of the output clock signal CKOUT remains 1.125*TCK.

Via repeating the abovementioned processes of adjusting the selecting control signals $SWA_1$-$SWA_3$ according to the output clock signal CKOUT, the period of the output clock signal CKOUT is adjusted to the period TCK of the input clock signal $CK_1$ times 1.125. In other words, the fractional dividing module 80 realizes the function of divide-by-1.125.

Figure 10:
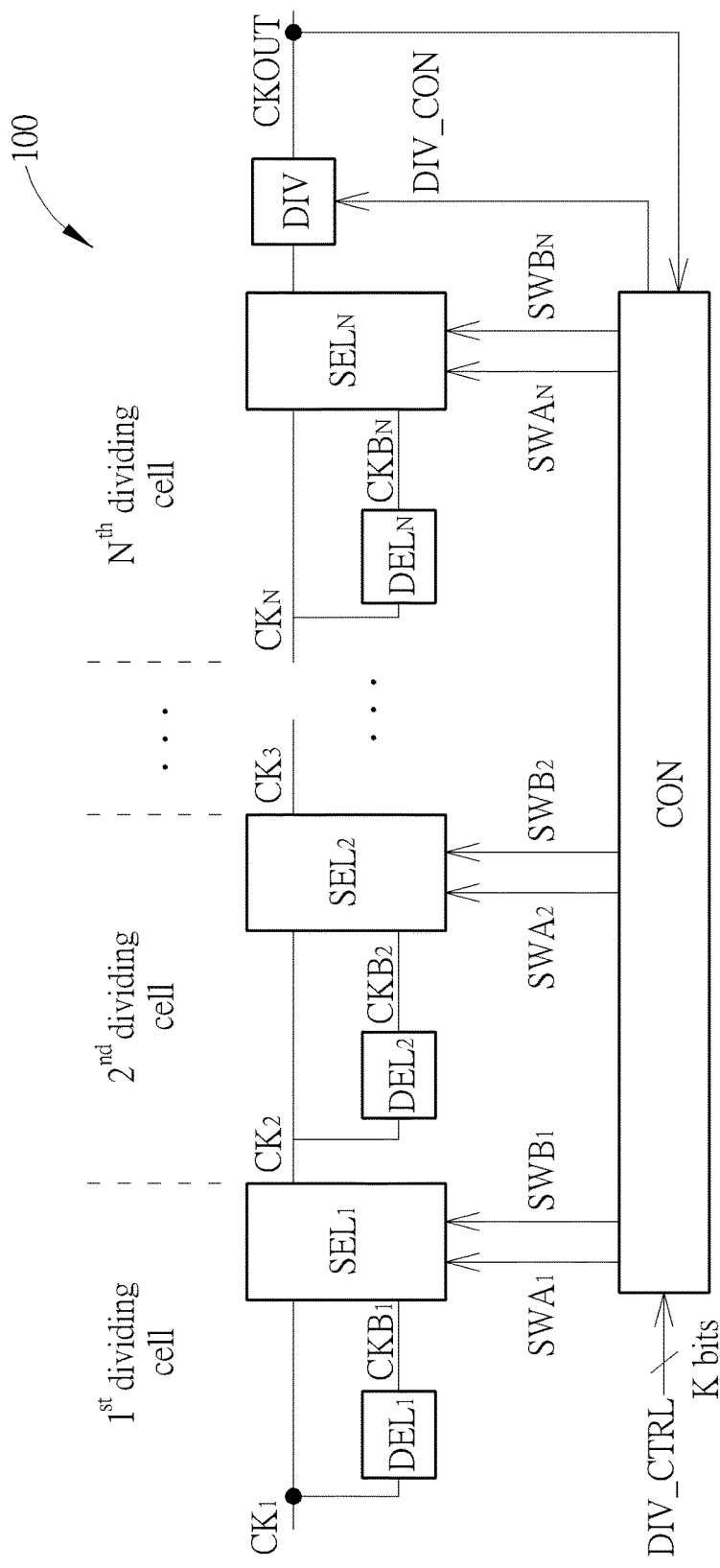
FIG. 10 is a schematic diagram of a fractional dividing module according to an example of the present invention.

According to different application and design concepts, those with ordinary skill in the art may observe appropriate alternations and modifications. In an example, the fractional dividing module 50 may further comprise a dividing unit for providing the divisor of quantization level 1. Please refer to FIG. 10, which is a fractional dividing module 100 according to an example of the present invention. The fractional dividing module 100 is similar to the fractional dividing module 50, thus the components and signal with the similar functions use the same symbols. Different from the fractional dividing module 50, the fractional dividing module 100 further comprises a dividing unit DIV. The dividing unit DIV is utilized for dividing the output signal of the selecting unit $SEL_N$ by a rational number indicated by a dividing control signal DIV_CON, which is generated by the control circuit CON. Note that, the quantization level of the rational number (i.e. the divisor provided by the dividing unit DIV) is 1. For example, the dividing unit DIV may be a divider providing a divide-by-⅔ function or a divide-by-½ function, and is not limited herein. After adding the dividing unit DIV, the quantization level of the fractional dividing module 100 can be shrunk to $0.5^N$. That is, the divisor of the fractional dividing module 100 may be $X+Y*0.5^N$, wherein X and Y are positive integers.

Figure 11:
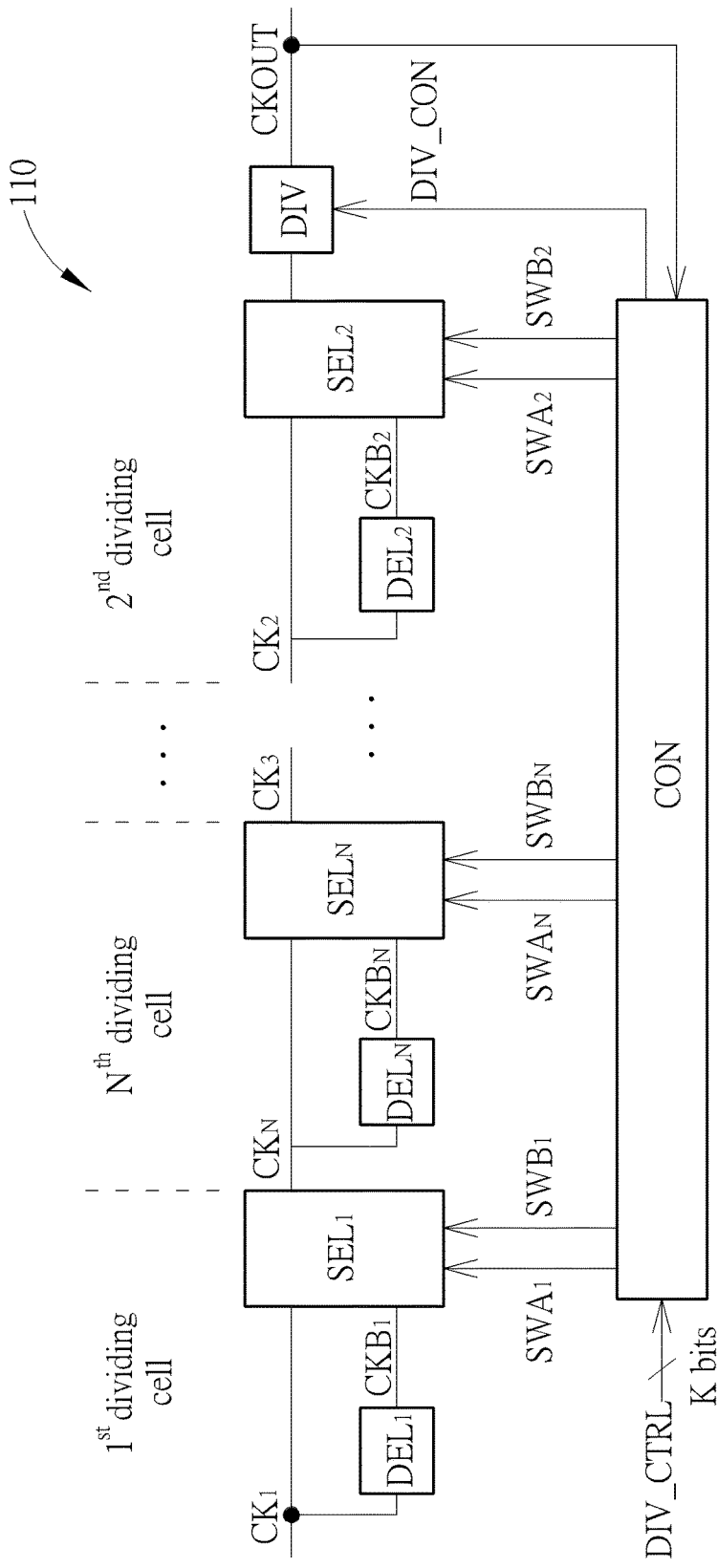
FIG. 11 is a schematic diagram of a fractional dividing module according to an example of the present invention.

In an example, the sequence of the N dividing cells in the fractional dividing module 50 or 100 can be modified and the function of the fractional dividing module 50 or 100 remains the same. Please refer to FIG. 11, which is a schematic diagram of a fractional dividing module 110 according to an example of the present invention. The fractional dividing module 110 is similar to the fractional dividing module 100, thus the components and signal with the similar functions use the same symbols. Different from the fractional dividing module 100, the $2^{nd}$ dividing cell exchanges with the $N^{th}$ dividing cell in the fractional dividing module 110.

Figure 12:
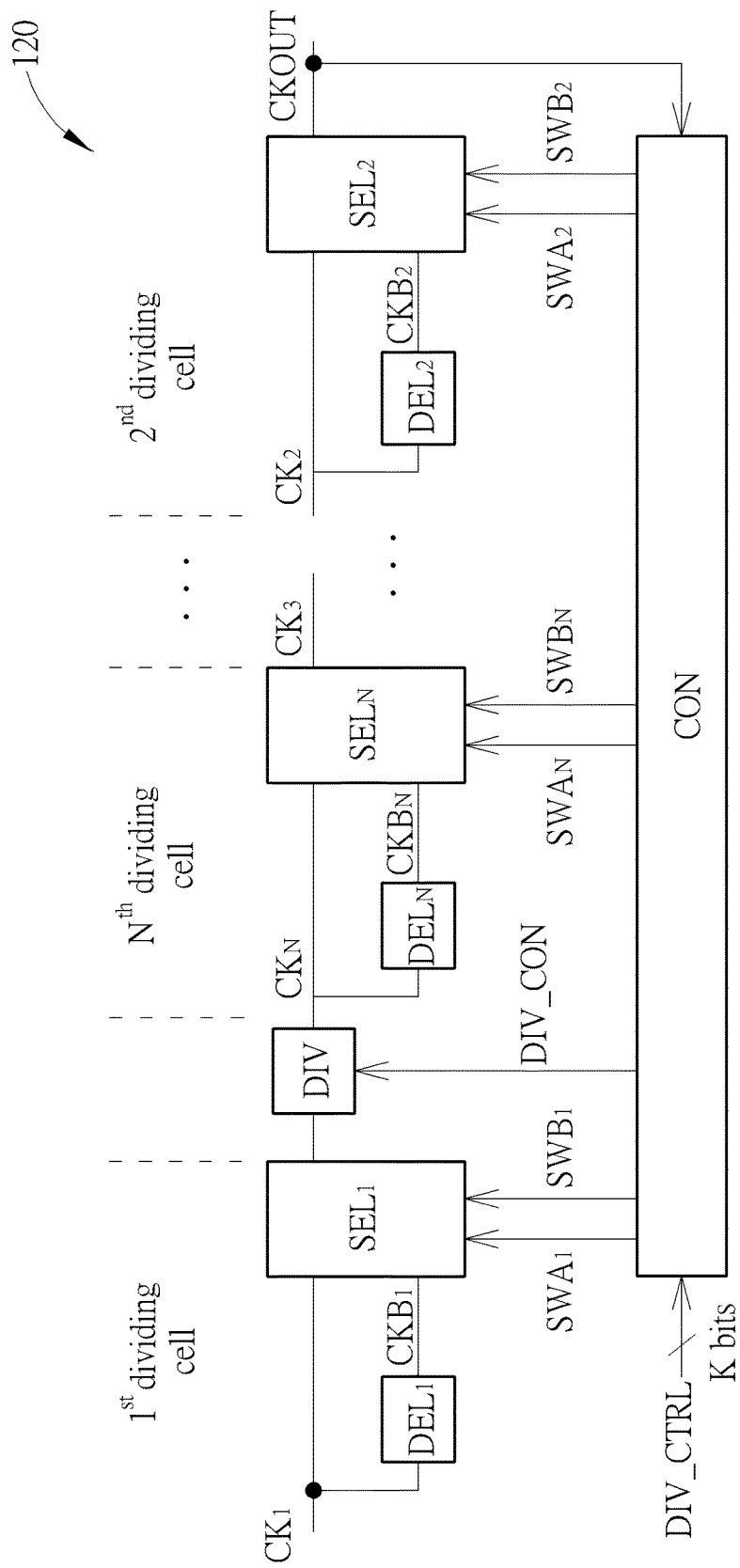
FIG. 12 is a schematic diagram of a fractional dividing module according to an example of the present invention.

In an example, the fractional dividing module 50 may further comprise a dividing unit and the sequence of the N dividing cells in the fractional dividing module 50 is modified at the same time. Note that, the dividing unit equips with the quantization level of (e.g. the divider providing the divide-by-⅔ function or divide-by-½ function) and is configured between two of the N dividing cells. Please refer to FIG. 12, which is a schematic diagram of a fractional dividing module 120 according to an example of the present invention. The fractional dividing module 120 is similar to the fractional dividing module 100, thus the components and signal with the similar functions use the same symbols. In this example, the $2^{nd}$ dividing cell exchanges with the $N^{th}$ dividing cell and the dividing unit DIV is configured between the $1^{st}$ dividing cell and the $N^{th}$ dividing cell.

Figure 13:
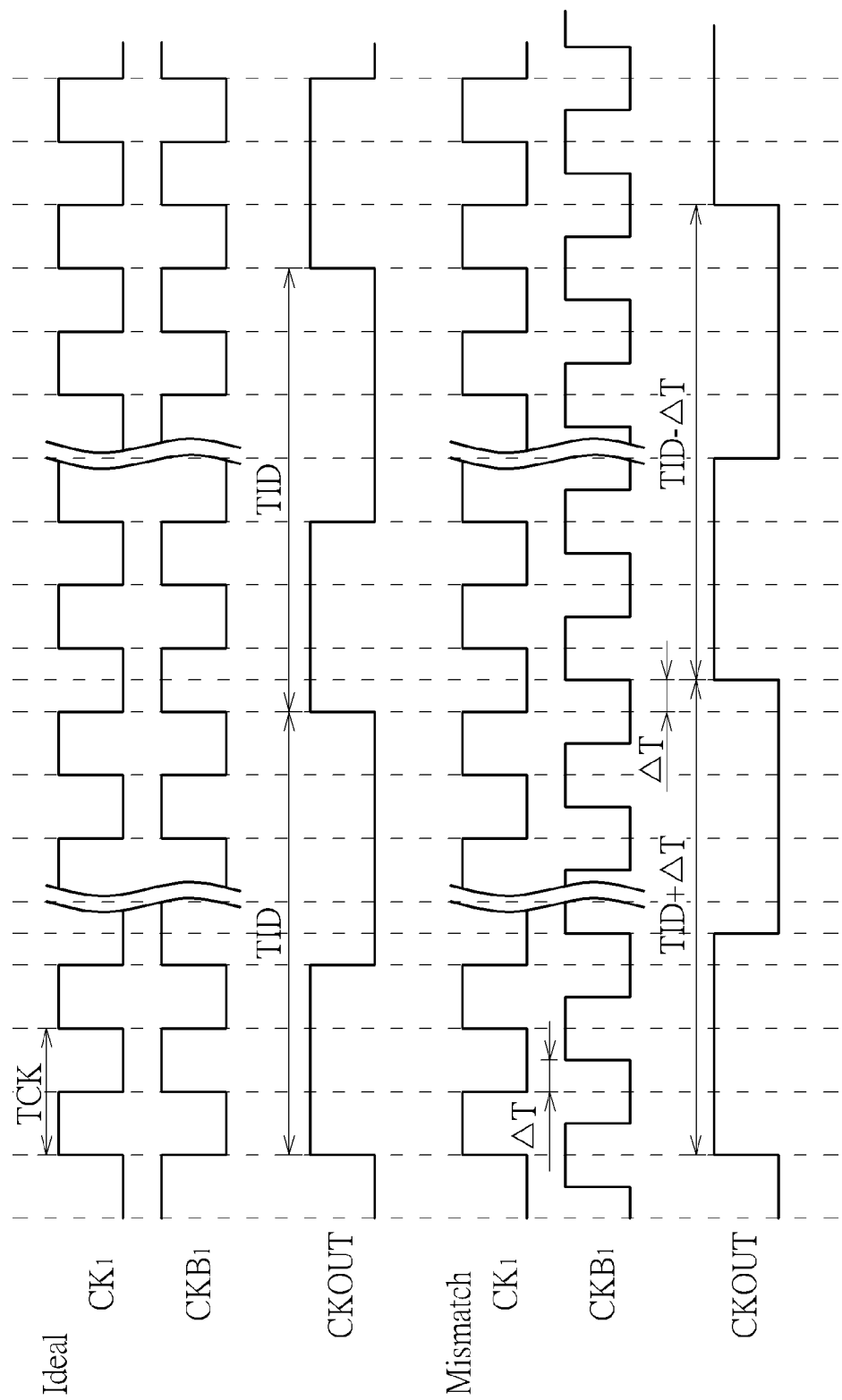
FIG. 13 is a schematic diagram of related signals of the fractional dividing module shown in FIG. 10.

If the delays of the delay units $DEL_1$-$DEL_N$ in the dividing cells deviate from the designed values, the output clock signal CKOUT would suffer phase disturbance due to the mismatch between input clock signals of the selecting units $SEL_1$-$SEL_N$. Please refer to FIG. 13, which is a schematic diagram of related signals of the fractional dividing module 100. In this example, the dividing control signal DIV_CTRL indicates the fractional dividing module 100 to realize the function of divide-by-(X+0.5). In the ideal case, the phase difference between the input clock signals $CK_1$ and $CKB_1$ is 0.5*TCK and the period of output clock signal CKOUT is an ideal period TID. In the mismatch case, the phase difference between the input clock signals $CK_1$ and $CKB_1$ is 0.5*TCK+ΔT. In such a condition, the first period of the output clock signal CKOUT becomes TID+ΔT and the second period of the output clock signal CKOUT becomes TID−ΔT, wherein TID=(X+0.5)*TCK. The phase noise of the output clock signal CKOUT rises due to the phase mismatch between the input clock signal $CK_1$ and $CKB_1$. When a PLL-based frequency synthesizer adopts the fractional dividing modules of the above examples, the high frequency quantization noise would be folded back to the operational frequency band of the PLL-based frequency synthesizer because of the phase disturbance in the output clock signal CKOUT. Thus, the delays of the delay unit $DEL_1$-$DEL_N$ in the N dividing cells require to be calibrated.

Figure 14:
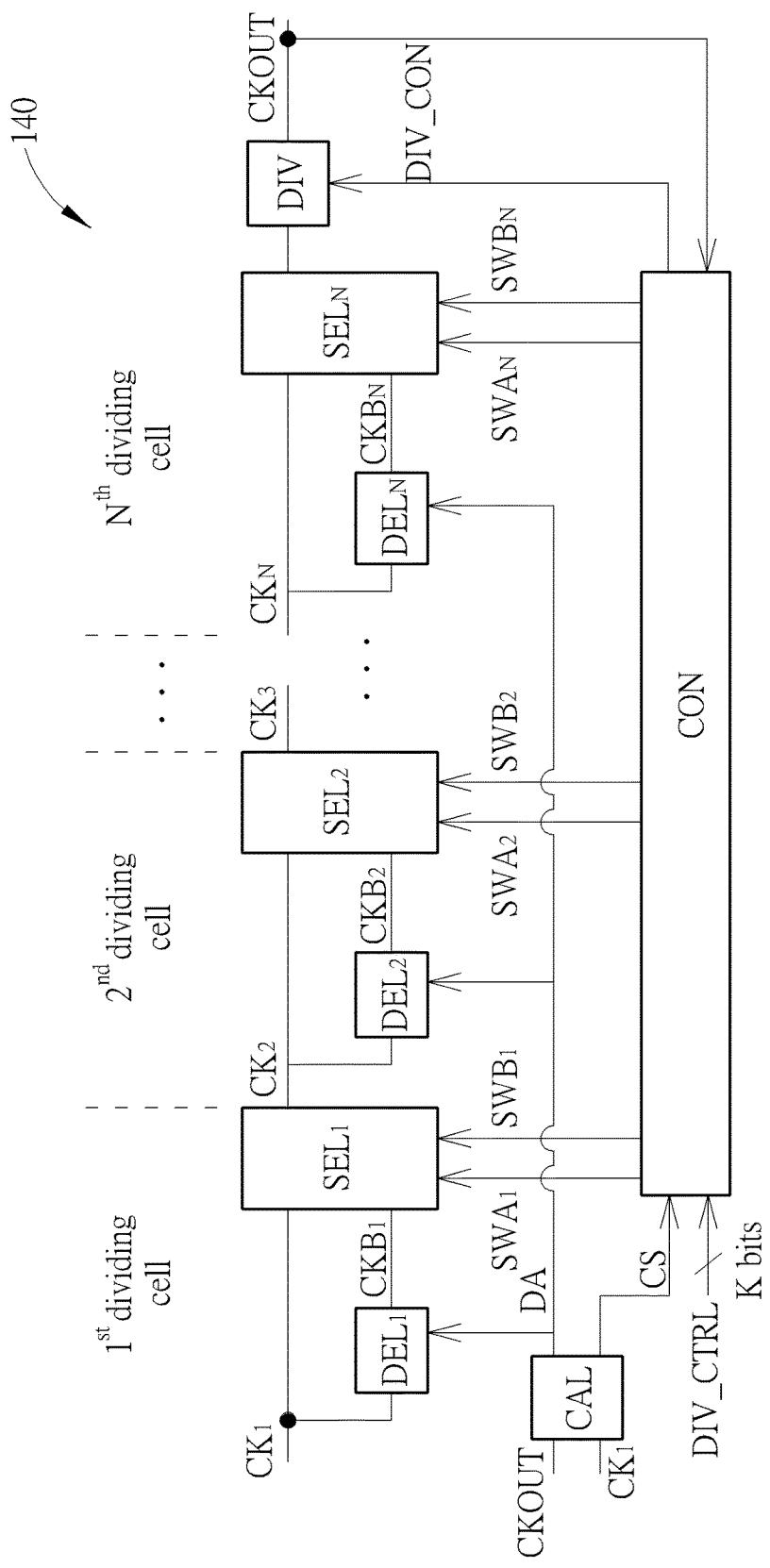
FIG. 14 is a schematic diagram of a fractional dividing module according to an example of the present invention.

Please refer to FIG. 14, which is a schematic diagram of a fractional dividing module 140 according to an example of the present invention. The fractional dividing module 140 may be a divider in an integrated circuit, and is not limited herein. The fractional dividing module 140 is similar to the fractional dividing module 100, thus the components and signal with the similar functions use the same symbols. In this example, the fractional dividing module 140 includes a calibration unit CAL and the calibration unit CAL is utilized for adjusting the delays of the delay units $DEL_1$-$DEL_N$ according to the output clock signal CKOUT and the input clock signal $CK_1$.

When a calibration process begins, the calibration unit CAL adjusts and generates a calibration signal CS for configuring the control circuit CON to perform the function of divide-by-$(X+0.5^m)$, wherein $0<m\le N$. The calibration unit CAL compares a clock period TCP1 with a clock period TCP2 subsequent to the clock period TCP1 of the output clock signal CKOUT, to acquire the relationship between the clock periods TCP1 and TCP2. If the time difference between the clock periods TCP1 and TCP2 is not equal to 0 (i.e. TCP1≠TCP2), the calibration unit CAL adjusts the delay unit $DEL_m$ according to the compared result. The calibration unit CAL repeats the above process of comparing the 2 contiguous clock periods TCP1 and TCP2 and adjusting the delay unit $DEL_m$ according to the compared results till the clock periods TCP1 and TCP2 become the same. The delay of the delay unit $DEL_m$ is therefore calibrated to the designed value (i.e. $2^{-m}$ of the clock period TCK).

Note that, the calibration processes of the delay units $DEL_1$-$DEL_N$ are required to be performed sequentially. In other words, the calibration process of the delay unit $DEL_m$ is performed after the delays of the delay units $DEL_1$-$DEL_{m-1}$ are calibrated, or the calibration process of the delay unit $DEL_m$ may work abnormally.

Figure 15:
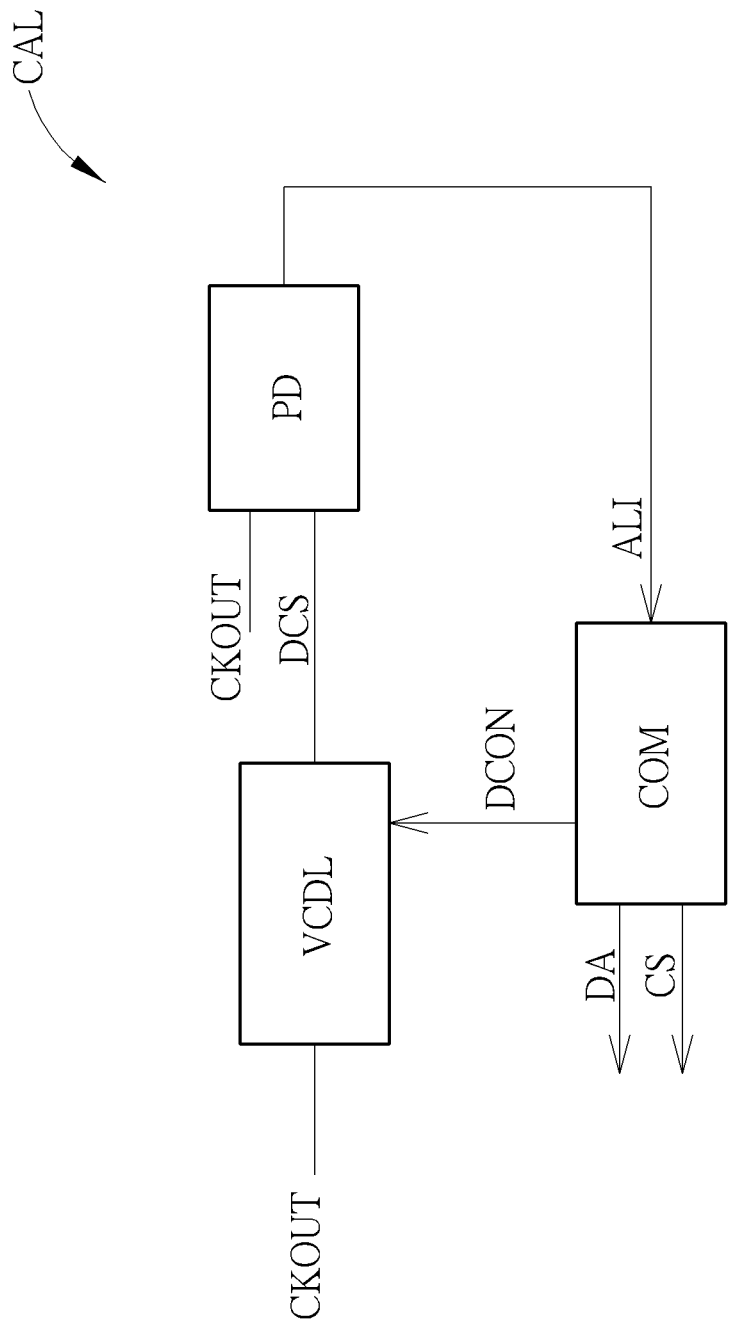
FIG. 15 is a schematic diagram of the calibration unit according to an example of the present invention.

The calibration unit CAL can be implemented variously. Please refer to FIG. 15, which is a schematic diagram of the calibration unit CAL according to an example of the present invention. As shown in FIG. 15, the calibration unit CAL comprises a delay unit VCDL, a phase detecting unit PD, and a computing unit COM. The delay unit VCDL may be a voltage control delay line and is utilized for delaying the output clock signal CKOUT according to a delay control signal DCON, to generate a delayed clock signal DCS. The phase detecting unit PD is utilized for detecting whether a rising edge of the output clock signal CKOUT and a rising edge of the delayed clock signal DCS are aligned, to generate a detecting signal ALI. In other words, the phase detecting unit PD generates the detecting signal ALI by detecting the relation of a relative position between the output clock signal CKOUT and the delayed clock signal CDS. The computing unit COM may be a digital circuit and is utilized for generating the calibration signal CS, the delay control signal DCON and a delay adjusting signal DA.

When a calibration process begins, the computing unit COM adjusts the calibration signal CS for configuring the control circuit CON to perform the function of divide-by-$(X+0.5^m)$, wherein 0<m≤N. Next, the computing unit COM adjusts the delays of the delay unit VCDL via a delay control signal DCON, to align a rising edge RE1 of the clock period TCP1 in the delayed clock signal DCS with a rising edge RE2 of a clock period TCP2 subsequent to the clock period TCP1 in the output clock signal CKOUT. When the computing unit COM determines the rising edge RE1 in the delayed clock signal DCS aligns the rising edge RE2 in the output clock signal CKOUT according to the detecting signal ALI, the computing unit COM determines the relationship between the clock periods TCP1 and TCP2 via sampling the output clock signal CKOUT at the rising edge RE2 in the delayed clock signal DCS. If the clock period TCP1 differs from the clock period TCP2, the computing unit COM adjusts the delay adjusting signal DA, to calibrate the delays of the delay unit $DEL_m$. Via repeating the above process till the clock periods TCP1 is equal to TCP2, the delay of the delay unit $DEL_m$ can be calibrated to the designed value (i.e. $2^{-m}$ of the clock period TCK).

Figure 16:
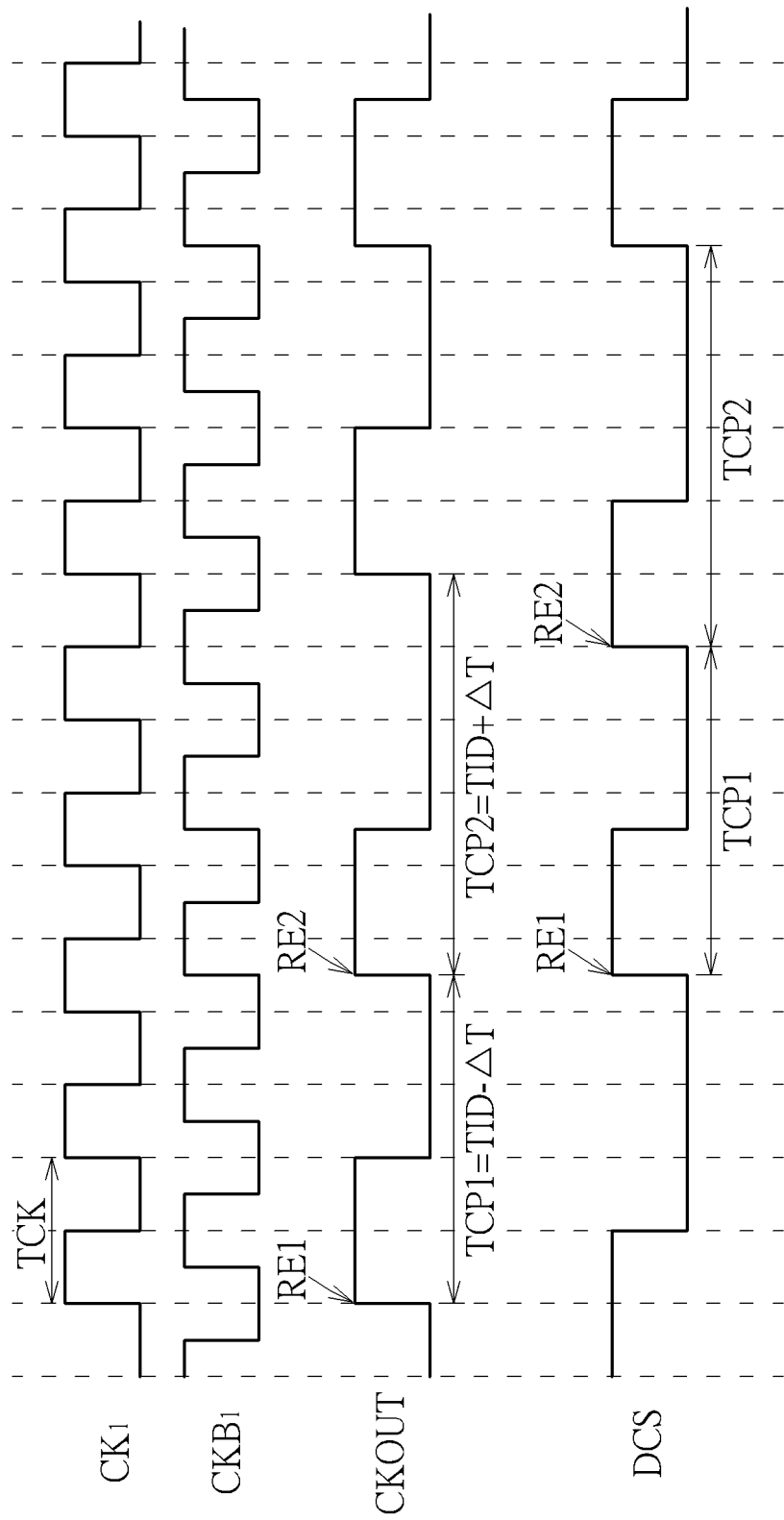
FIG. 16 is a schematic diagram of related signals of the calibration unit shown in FIG. 15.

Please refer to FIG. 16, which is schematic diagram of related signals of the calibration unit CAL shown in FIG. 15. In this example, the calibration unit CAL configures the control circuit CON to perform the function of divide-by-2.5 via the calibration signal CS. Since the delay of the delay unit DEL1 deviates from the 0.5*TCK to the 0.25*TCK, the clock period TCP1 becomes TID−ΔT and the clock period TCP2 becomes TID+ΔT, wherein TID=2.5*TCK and ΔT=0.25TCK. As shown in FIG. 16, the computing unit COM adjusts the delay control signal DCON to align the rising edge RE1 of the clock period TCP1 in the delayed clock signal DCS and the rising edge RE2 of the clock period TCP2 in the output clock signal CKOUT. After the rising edge RE1 of the clock period TCP1 in the delayed clock signal DCS aligns the rising edge RE2 of the output clock signal CKOUT, the computing unit COM determines the relationship between the clock periods TCP1 and TCP2 via sampling the output clock signal CKOUT at the rising edge RE2 in the delayed clock signal and accordingly generate the delay adjusting signal DA. As shown in FIG. 16, the clock period TCP1 differs from the clock period TCP2. The computing unit COM therefore adjusts the delay of the delay unit DEL1 via the delay adjusting signal DA.

Figure 17A:
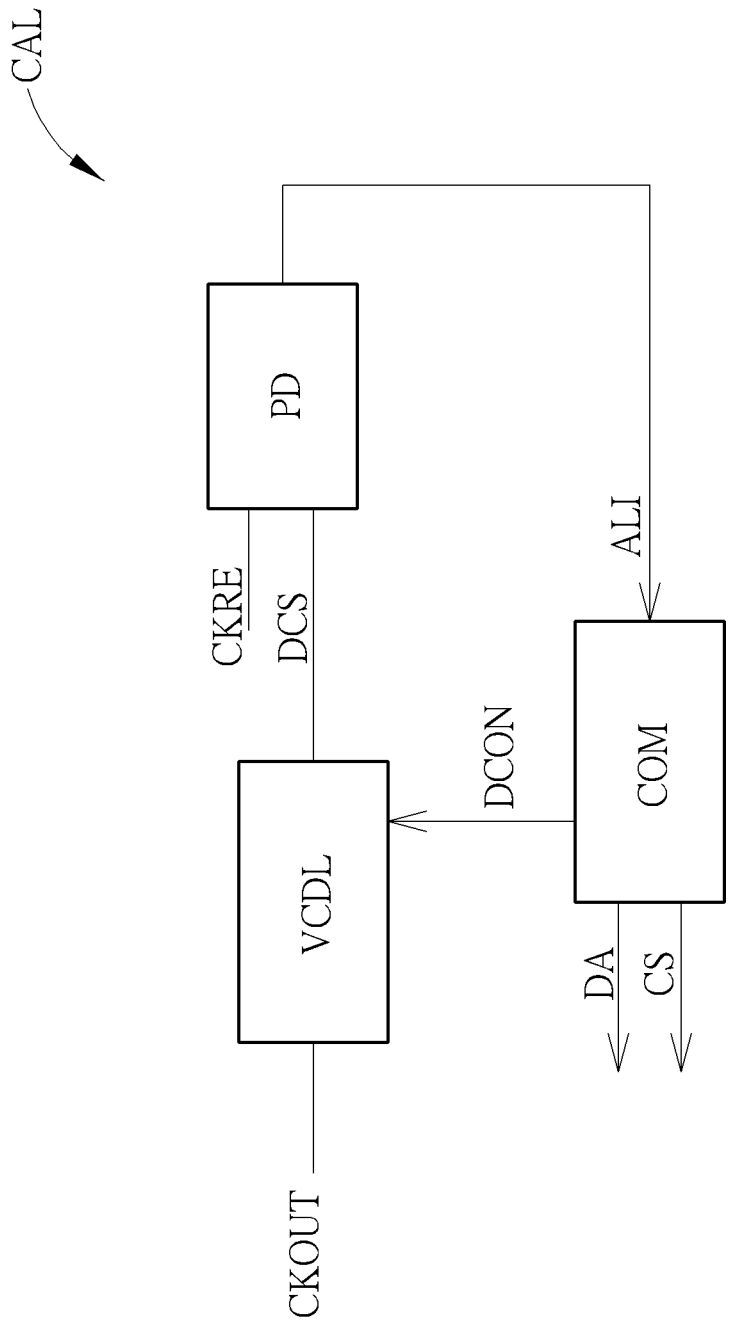
FIG. 17A is a schematic diagram of the calibration unit according to an example of the present invention.
Figure 17B:
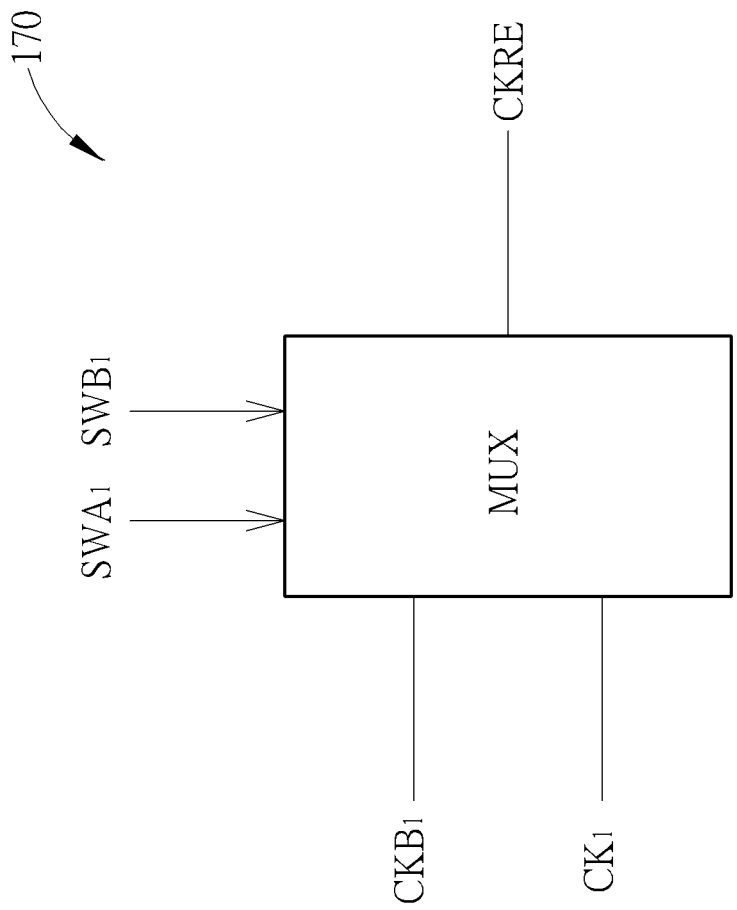
FIG. 17B is a schematic diagram of the circuit for generating the retiming clock signal shown in FIG. 17A.

Please refer to FIG. 17A, which is a schematic diagram of the calibration unit CAL according to an example of the present invention. The calibration unit CAL shown in FIG. 17A is similar to that shown in FIG. 15, thus the components and signals with the similar functions use the same symbols. Different from the calibration unit CAL shown in FIG. 15, the phase detecting unit PD in FIG. 17A changes to generate the detecting signal ALI according to the relationships between rising edges of the delayed clock signal DCS and a retiming clock signal CKRE, wherein the retiming clock signal CKRE is provided by other circuits in the frequency dividing module and is utilized for retiming the output clock signal CKOUT. Please refer to FIG. 17B, which is a schematic diagram of retiming unit 170 for generating the retiming clock signal CKRE shown in FIG. 17A. The retiming unit may be configured in frequency dividing module 140 or the calibration unit CAL shown in FIG. 17A for generating the retiming clock signal CKRE according to the selecting control signals $SWA_1$ and $SWB_1$, and the input clock signals $CK_1$ and $CKB_1$. The retiming clock signal CKRE is utilized for retiming the output clock signal CKOUT, to reduce the jitter of the output clock signal CKOUT. As shown in FIG. 17B, the retiming unit comprises a multiplexer MUX. The multiplexer MUX is utilized for outputting one of the input clock signals $CK_1$ and $CKB_1$ as the retiming clock signal CKRE according to the selecting control signals $SWA_1$ and $SWB_1$. Different from the selecting unit $SEL_1$ shown in FIG. 14, the multiplexer MUX outputs the input clock signal $CKB_1$ when the selecting control signal $SWA_1$ is "1" and the selecting control signal $SWB_1$ is "0" and outputs the input clock signal $CK_1$ when the selecting control signal SWA1 is "0" and the selecting control signal $SWB_1$ is "1". Via utilizing the retiming clock signal CKRE, the delay of the delay unit VCDL can be reduced when the computing unit COM calibrates the delay unit $DEL_1$, so as to decrease the hardware cost of the delay unit VCDL.

Figure 18:
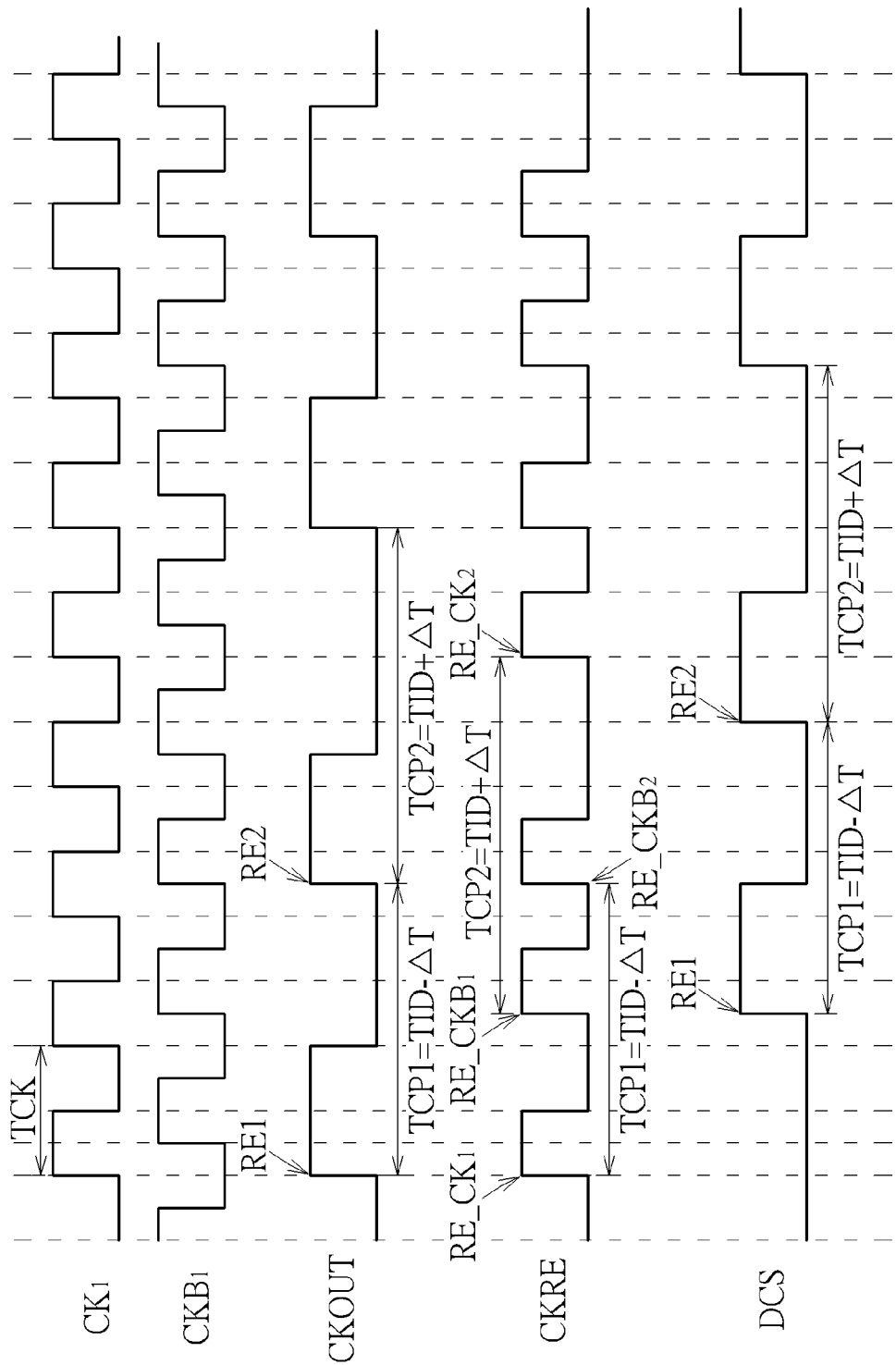
FIG. 18 is a schematic diagram of related signals of the calibration unit shown in FIG. 17A.

As to detailed operations of the calibration unit CAL shown in FIG. 17A, please refer to FIG. 18 which is a schematic diagram of related signals of the calibration unit CAL shown in FIG. 17. In this example, the calibration unit CAL configures the control circuit CON to perform the function of divide-by-2.5 via the calibration signal CS. Since the delay of the delay unit $DEL_1$ deviates from 0.5*TCK to 0.25*TCK, the clock period TCP1 becomes TID−ΔT and the clock period TCP2 becomes TID+ΔT, wherein TID=2.5*TCK and ΔT=0.25TCK. Because the retiming clock signal CKRE is generated by swapping the input clock signals $CKB_1$ and $CK_1$ according to the selecting control signal $SWA_1$, a period between the first rising edge $RE\_CK_1$ corresponding to the input clock signal $CK_1$ in the retiming clock signal CKRE and the second rising edge RE_CKB$_2$ corresponding to the input clock signal CKB$_1$ in the retiming clock signal CKRE is equal to TID−ΔT; and a period between the first rising edge RE_CKB$_1$ corresponding to the input clock signal CKB$_1$ and the second rising edge RE_CK$_2$ corresponding to the input clock signal CK$_1$ in the retiming clock signal CKRE is equal to TID+ΔT. Under such a condition, the computing unit COM only needs to align the rising edge RE1 of the delayed clock signal DCS with the rising edge RE_CKB$_1$ and the computing unit COM can determine the relationship between the time periods TCP1 and TCP2 via sampling the retiming clock signal CKRE at the rising edge RE2 of the delayed clock signal DCS. When determining the time periods TCP1 and TCP2 are different, the computing unit COM accordingly calibrates the delay unit DEL$_1$ via the delay adjusting signal DA. In comparison with the delay between the output clock signal CKOUT and the delayed clock signal DCS (i.e. the delay generated by the delay unit VCDL) shown in FIG. 16, the delay generated by the delay unit VCDL is reduced and the hardware cost of delay unit VCDL is therefore decreased.

Figure 19:
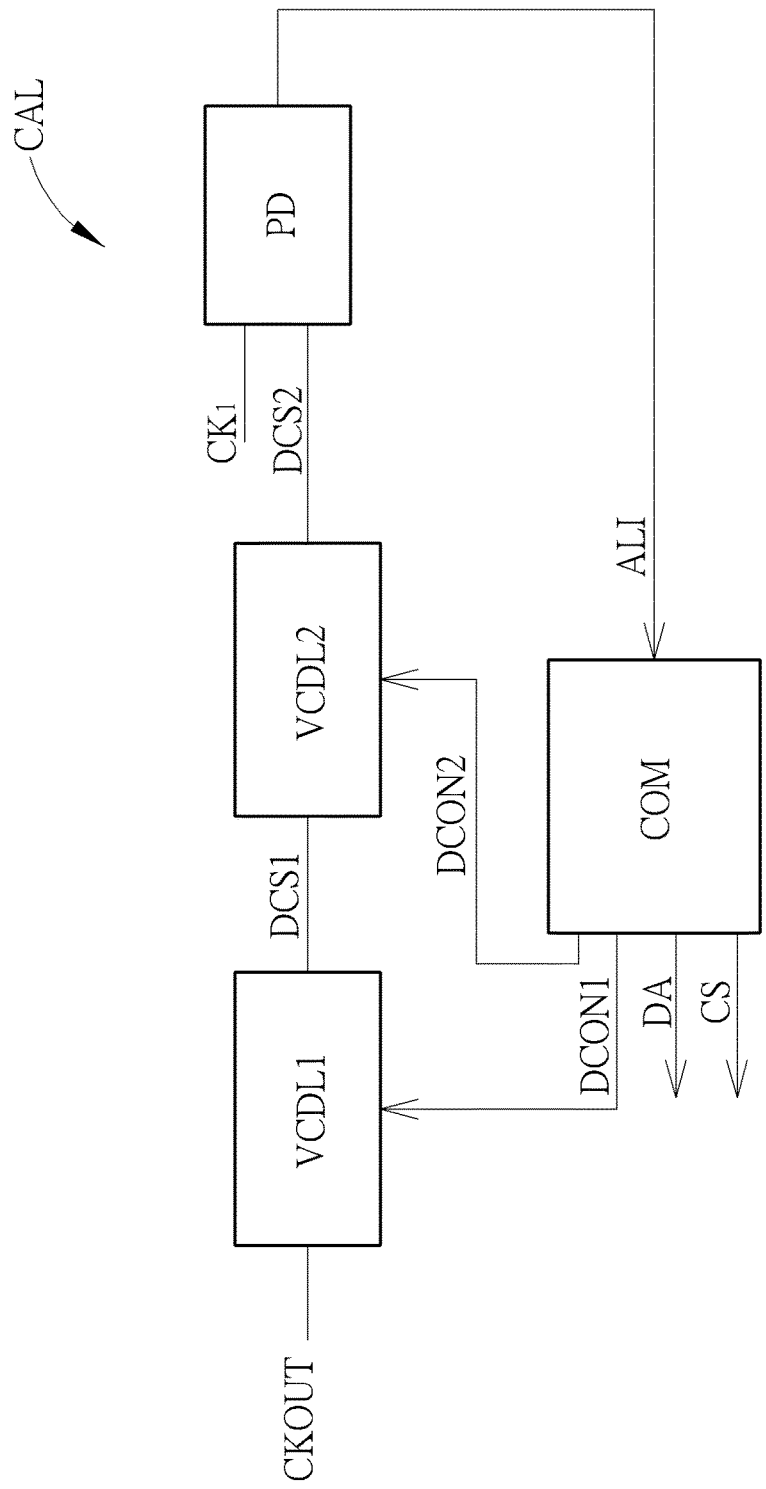
FIG. 19 is a schematic diagram of the calibration unit according to an example of the present invention.

In an example, the calculating unit CAL may use the input clock signal CK$_1$ as a reference ruler to determine the relationship between the clock periods TCP1 and TCP2. Please refer to FIG. 19, which is a schematic diagram of the calibration unit CAL according to an example of the present invention. As shown in FIG. 19, the calibration unit CAL comprises delay units VCDL1, VCDL2, a phase detecting unit PD, and a computing unit COM. The delay units VCDL1 and VCDL2 may be voltage control delay lines and are not limited herein. The delay unit VCDL1 is utilized for delaying the output clock signal CKOUT to generate a delayed clock signal DCS1. The delay unit VCDL2 is utilized for delaying the delayed clock signal DCS1 to generate a delayed clock signal DCS2. The phase detecting unit PD is utilized for detecting relationships among rising edges of the input clock signal CK$_1$ and rising edges of the delayed clock signal DCS2, to generate a detecting signal ALI. The computing unit COM may be a digital circuit and is utilized for generating the calibration signal CS, a delay control signal DCON1 to adjust the delay of the delay unit VCDL1, a delay control signal DCON2 to adjust the delay of the delay unit VCDL2 and the delay adjusting signal DA to adjust the delays of the delay units DEL$_1$-DEL$_N$.

In details, the computing unit COM configures the control circuit CON to perform the function of divide-by-(X+0.5$^m$) via adjusting the calibration signal CS, wherein 0<m≤N. Next, the computing unit COM adjusts the delay of the delay unit VCDL1 via the delay control signal DCON1 to make the rising edge RE1 of the clock period TCP1 in the delay clock signal DCS2 align a rising edge REREF1 of the input clock signal CK$_1$. After the rising edge RE1 aligns the rising edge RE—REF1, the computing unit COM adjusts the delay of the delay unit VCDL2 via the delay control signal DCON2, to align the rising edge RE2 of the clock period TCP2 subsequent to the clock period TCP1 and a rising edge RE_REF2 of the input clock signal CK$_1$, wherein the rising edge RE_REF2 is the first rising edge ahead of the rising edge RE2 in the input clock signal CK$_1$. The computing unit COM determines a time difference T1 between the rising edge RE2 and the rising edge RE_REF2 at the time of the rising edge RE1 aligns the rising edge RE_REF1 according to the delay variation of adjusting the delay unit VCDL2 for aligning the rising edge RE2 and the rising edge RE_REF2.

After acquiring the time difference T1, the computing unit COM adjusts the delay of the delay unit VCDL1 via the delay control signal DCON1, to align the rising edge RE2 and the rising edge RE_REF2. Next, the computing unit COM adjusts the delay of the delay unit VCDL2 via the delay control signal DCON2, to align a rising edge RE3 subsequent to the rising edge RE2 in the delayed clock signal DCS2 and a rising edge RE_REF3 of the input clock signal CK$_1$, wherein the rising edge RE_REF3 is the first rising edge ahead of the rising edge RE2 in the input clock signal CK$_1$. The computing unit COM determines a time difference T2 between the rising edge RE3 and the rising edge RE_REF3 at the time of the rising edge RE2 aligns the rising edge RE_REF2 according to the delay variation of adjusting the delay unit VCDL2 for aligning the rising edge RE3 and the rising edge RE_REF3. The computing unit COM therefore can determine the relationship between the clock periods TCP1 and TCP2 according to the time differences T1 and T2, and accordingly calibrates the delay of the delay unit DEL$_m$.

Figure 20:
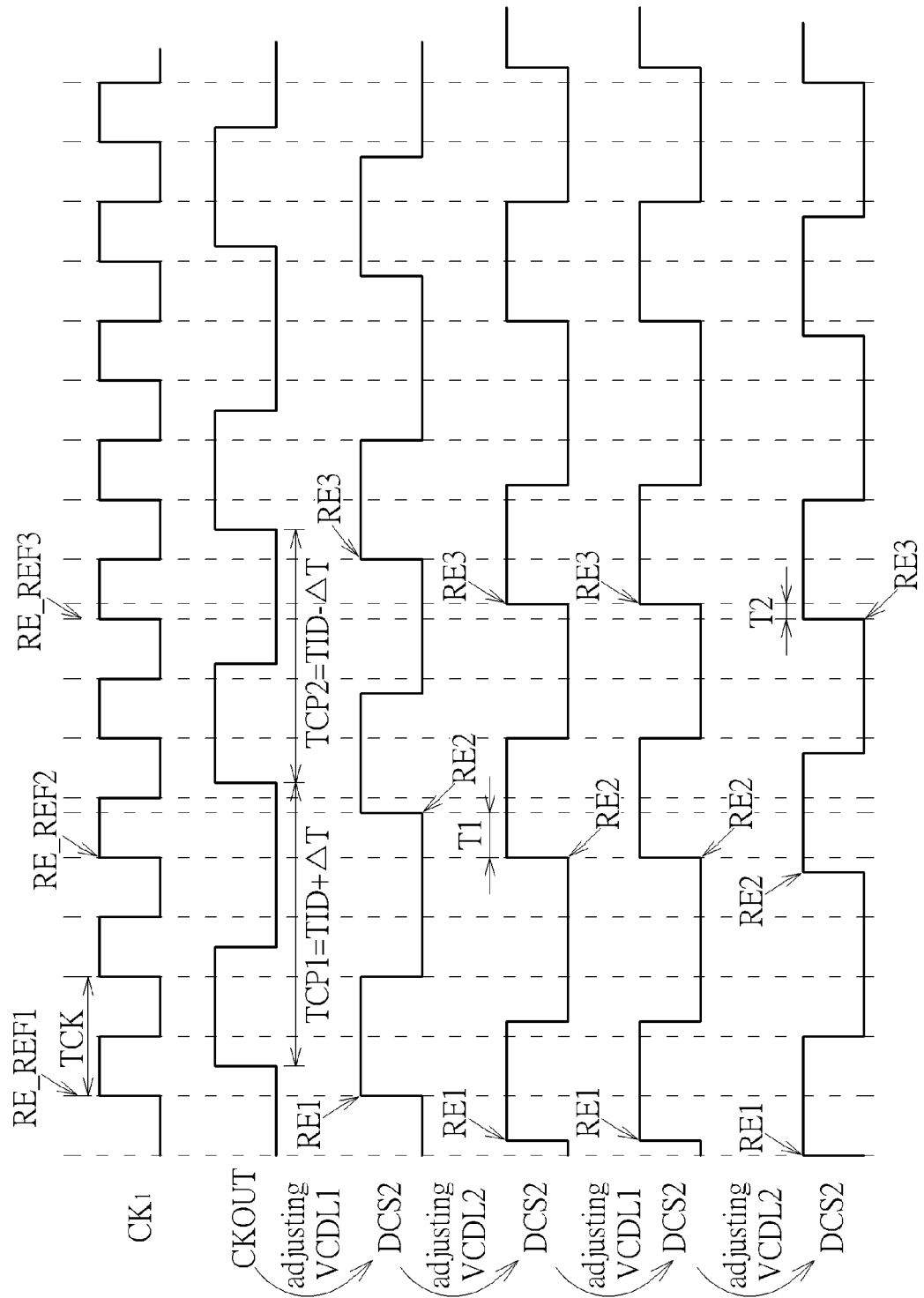
FIG. 20 is a schematic diagram of related signals of the calibration unit shown in FIG. 19.

Please refer to FIG. 20, which is a schematic diagram of related signals of the calibration unit CAL shown in FIG. 19. In this example, the delay unit DEL$_1$ has been calibrated and the calibration unit CAL configures the control circuit CON to perform the function of divide-by-2.25 via the calibration signal CS. Since the delay of the delay unit DEL$_2$ deviates from 0.25*TCK to 0.375*TCK, the clock period TCP1 becomes TID+ΔT and the clock period TCP2 becomes TID−ΔT, wherein TID=2.25*TCK and ΔT=0.125TCK. In the beginning, the computing unit COM adjusts the delay of the delay unit VCDL1 to align the rising edge RE1 of the clock period TCP1 in the delayed clock signal DCS2 and the rising edge RE_REF1 in the input clock signal CK$_1$. Next, the computing unit COM adjusts the delay of the delay unit VCDL2 to align the rising edge RE2 and the rising edge RE_REF2 in the input clock signal CK$_1$, wherein the rising edge RE_REF2 is the first rising edge ahead of the rising edge RE2 in the input clock signal CK$_1$. The computing unit COM therefore determines the time difference T1 between the rising edges RE2 and RE_REF2 at the time of the rising edge RE1 aligns the rising edge RE_REF1 is 0.75*TCK. After acquiring the time difference T1, the computing unit COM adjusts the delay of the delay unit VCDL1 to align the rising edges RE2 and RE_REF2. Next, the computing unit COM adjusts the delay of the delay unit VCDL2 to align the rising edge RE3 and the rising edge RE_REF3 in the input clock signal CK$_1$, wherein the rising edge RE_REF3 is the first rising edge ahead of the rising edge RE3 in the input clock signal CK$_1$. The computing unit COM therefore can determine the time difference T2 between the rising edges RE3 and RE_REF3 at the time of the rising edge RE2 aligns the rising edge RE_REF2 is 0.125*TCK.

As can be seen from FIG. 20, the clock period TCP1 can be expressed as 2*TCK+T1 and the clock period TCP2 can be expressed as 2*TCK+T2. In other words, the computing unit COM can determine the relationship between the clock periods TCP1 and TCP2 via comparing the time differences T1 and T2 and accordingly calibrates the delay unit DEL$_2$.

Note that, the calibration units CAL shown in FIGS. 15, 17A and 19 also can be utilized in the fractional dividing module 10 since the fractional dividing module 10 is the example when N=1.

Figure 21:
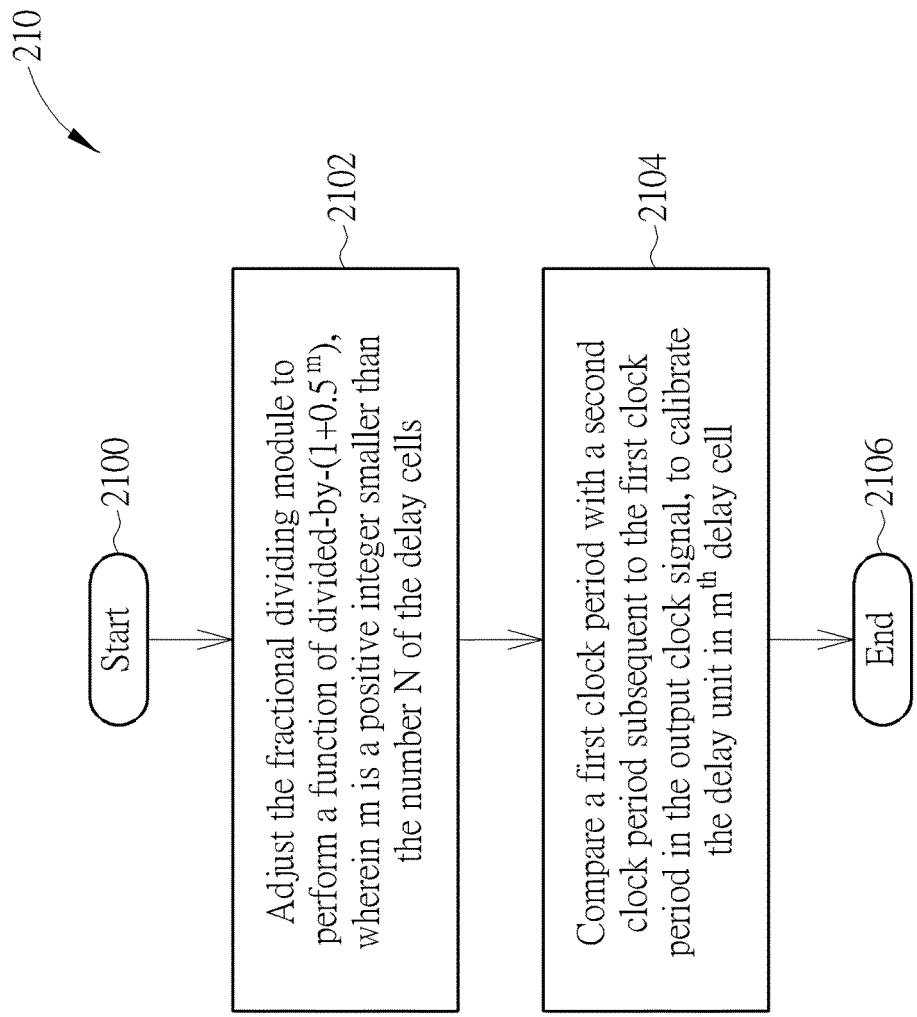
FIG. 21 is a flowchart of a calibration method according to an example of the present invention.

The process of the calibration unit CAL calibrating the delays of the delay units in the fraction dividing module 140 can be summarized into a calibration method 210 shown in FIG. 21. The calibration method 210 can be utilized in a calibration unit of a fraction dividing module comprising a control circuit, for generating a plurality of selecting control signals according to an output clock signal and a dividing control signal; and N dividing cells, for generating an output clock signal according to an input clock signal and the plurality of selecting control signals; wherein the $i^{th}$ dividing cell among N dividing cells comprises a delay unit, for delaying a first input signal $0.5^i$ of a clock period of the input clock signal, to generate a second input signal; and a selecting unit, for outputting one of the first input signal and the second input signal as an output signal according to the $i^{th}$ selecting control signal of the plurality of selecting control signals, wherein the output signal is the first input signal of the $(i+1)^{th}$ dividing cell; wherein the input clock signal is the first input signal of $1^{st}$ dividing cell and the output clock signal is the output signal of the $N^{th}$ dividing cell. When the dividing control signal indicates the function of divide-by-$(1+0.5^m)$, the control circuit generates the $i^{th}$ selecting control signal by dividing the output clock signal by $2^{(m-i+1)}$ when $0<i\leq m$ and maintains the $i^{th}$ selecting control signal to control the selecting unit of the $i^{th}$ dividing cell to output the first input signal when $m<i\leq N$. The calibration method 210 comprises the following steps:

Step 2100: Start.

Step 2102: Adjust the fractional dividing module to perform a function of divided-by-$(1+0.5^m)$, wherein m is a positive integer smaller than the number N of the delay cells.

Step 2104: Compare a first clock period with a second clock period subsequent to the first clock period in the output clock signal, to calibrate the delay unit in $m^{th}$ delay cell.

Step 2106: End.

According to the calibration method 210, a calibration unit of the fractional dividing module first controls the fractional dividing module to perform the function of divide-by-$(1+0.5^m)$. Next, the calibration unit calibrates the delay unit in the $m^{th}$ delay cell via comparing the contiguous first clock period and the second clock period. Note that, the calibration process of the delay unit in the $m^{th}$ delay cell requires to be performed after the delays of the delay units in the $1^{st}$-$(m-1)^{th}$ delay cells are calibrated, or the calibration process of the delay unit in the $m^{th}$ delay cell may work abnormally.

The method of comparing the contiguous first clock period and the second clock period may be various. For example, the calibration unit may delays the output clock signal to generate a delayed clock signal and aligns a first rising edge of the first clock period in the delayed clock signal with a second rising edge of the second clock period in the output clock signal. Via sampling the output clock signal at the second rising edge in the delayed clock signal when the first rising edge of the first clock period in the delayed clock signal aligns the second rising edge in the output clock signal, the calibration unit determines the relationship between the first clock period and the second clock period (e.g. whether the first clock period is equal to the second clock period) and accordingly adjusts the delay unit in the $m^{th}$ delay cell. The abovementioned comparing process can be referred to FIG. 16, and are not narrated herein for brevity.

In another example, the calibration unit may utilize the input clock signal as a reference ruler for determining the relationship between the contiguous first clock period and the second clock period. In this example, the calibration unit delays the output clock signal to generate a delayed clock signal and aligns a first rising edge of the first clock period in the delayed clock signal with a first reference rising edge in the input clock signal. The calibration aligns a second rising edge of the second clock period with a second reference rising edge in the input clock signal, wherein the second reference rising edge is the first one rising edge ahead of the second rising edge in the input clock signal, and acquires a first time different between the second rising edge of the second clock period and the second reference rising edge in the input clock signal. Next, the calibration aligns a third rising edge of a third clock period subsequent to the second clock period and a third reference rising edge in the input clock signal, wherein the third reference rising edge is the first one rising edge ahead of the third rising edge in the input clock signal, and acquires a second time different between the second rising edge of the second clock period and the second reference rising edge in the input clock signal. Via comparing the first time difference and the second time difference, the calibration unit determines the relationship between the first clock periods and the second clock periods and accordingly calibrates the delay unit in the $m^{th}$ delay cell. The abovementioned comparing process can be referred to FIG. 20, and are not narrated herein for brevity.

According the structures of the fractional dividing modules in the above examples, the quantization level of the fractional dividing modules can be shrunk to power of $0.5^N$, wherein N is the number of stages of dividing cells in the fractional dividing modules. The quantization noises of a PLL-based frequency synthesizer can be significantly reduced if adopting the fractional dividing modules in the above examples. In addition, the fractional dividing modules of the above examples can be calibrated according to the calibration method of the above examples, to avoid the high frequency quantization noise being folded back to the operational frequency band of the PLL-based frequency synthesizer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fractional dividing module, comprising:
    an output clock generating circuit, for receiving an input clock signal and generating an output clock signal according to a first control signal, comprising:
        a first delay unit, for delaying the input clock signal to generate a delayed input clock signal; and
        a selecting unit, for selecting one of the input clock signal and the delayed input clock signal to generate the output clock signal according to the first control signal; and
    a control circuit, for dividing the output clock signal to generate the first control signal according to a dividing control signal, wherein the dividing control signal is adjusted to control a frequency ratio between the output clock signal and the input clock signal.

2. The fractional dividing module of claim 1, wherein the output clock generating circuit further comprises:
    a dividing unit, for dividing an output signal of the selecting unit by a rational number to generate the output clock signal.

3. The fractional dividing module of claim 1, wherein the control circuit comprises:
    a flip-flop, for outputting the first control signal and an inverse first control signal in response to the output clock signal and a data signal;
    an AND gate, for outputting the data signal in response to the inverse first control signal and the dividing control signal.

4. The fractional dividing module of claim 3, wherein the control circuit further comprises:

a timing control circuit, coupled to the flip-flop for generating a first non-overlapping control signal and a second non-overlapping control signal according to the first control signal, wherein the first non-overlapping control signal and the second non-overlapping control signal are non-overlapped.

5. The fractional dividing module of claim 1, further comprising:
a calibration unit, for generating a delay adjusting signal to adjust delay time of the first delay unit according to the input clock signal and the output clock signal.

6. The fractional dividing module of claim 5, wherein the calibration unit comprises:
a second delay unit, for delaying the output clock signal according to a delay control signal to generate the delayed output clock signal;
a phase detecting unit, for detecting a relation of a relative position between the output clock signal and the delayed output clock signal to generate a detecting signal; and
a computing unit, for generating a calibration signal to control the control circuit; generating the delay control signal according to the detecting signal; comparing a first clock period and a second clock period via sampling the output clock signal to generate the delay adjusting signal.

7. The fractional dividing module of claim 6, wherein the calibration signal generated by the computing unit is to control the control circuit to divide the output clock signal by 2 and to generate the selecting control signal.

8. The fractional dividing module of claim 6, wherein the delay control signal generated by the computing unit is to align a first rising edge of the first clock period in the delayed clock signal with a second rising edge of the second clock period in the output clock signal.

9. The fractional dividing module of claim 8, wherein the computing unit compares the first clock period and the second clock period via sampling the output clock signal at the second rising edge in the delayed clock signal when the first rising edge of the first clock period in the delayed clock signal aligns the second rising edge of the second clock period in the output clock signal.

10. The fractional dividing module of claim 5, wherein the calibration unit comprises:
a second delay unit, for delaying the output clock signal according to a first delay control signal, to generate a first delayed clock signal;
a third delay unit for delaying the first delayed clock signal according to a second delay control signal, to generate a second delayed clock signal;
a phase detecting unit, for detecting a relation of a relative position between the input clock signal and the second delayed clock signal, to generate detecting signal; and
a computing unit, for generating a calibration signal to control the control circuit; generating the first delay control signal and the second delay control signal according to the detecting signal; and generating the delay adjusting signal according to a first time difference and a second time difference.

11. The fractional dividing module of claim 10, wherein the calibration signal generated by the computing unit is to control the control circuit to divide the output clock signal by 2 and to generate the selecting control signal.

12. The fractional dividing module of claim 10, wherein the first delay control signal generated by the computing unit is to align a first rising edge of the first clock period in the second delayed clock signal with a first reference rising edge of the input clock signal; the second delay control signal generated by the computing unit is to align a second rising edge of a second clock period in the second delayed clock signal with a second reference rising edge of the input clock signal when the first rising edge of the first clock period in the second delayed clock signal aligns with the first reference rising edge of the input clock signal, wherein the second reference rising edge is the first one rising edge ahead of the second rising edge in the input clock signal; and the computing unit acquires the time difference between the second rising edge of the second clock period in the second delayed clock signal and the second reference rising edge of the output clock signal according to the second delay control signal as the first time difference.

13. The fractional dividing module of claim 12, wherein the first delay control signal generated by the computing unit is to align the second rising edge of the second clock period in the second delayed clock signal with the second reference rising edge of the input clock signal; the second delay control signal generated by the computing unit is to align a third rising edge of a third clock period subsequent to the second clock period in the second delayed clock signal and a third reference rising edge of the input clock signal when the second rising edge of the second clock period in the second delayed clock signal aligns with the second reference rising edge of the input clock signal, wherein the third reference rising edge is the first one rising edge ahead of the third rising edge in the input clock signal; and the computing unit acquires the time difference between the third rising edge of the third clock period and the third reference rising edge of the input clock signal according to the second delay control signal as the second time difference.

14. A fractional dividing module, comprising:
a control circuit, for generating N selecting control signals according to a first output clock signal and a fractional divisor and a dividing control signal according to the fractional divisor;
N dividing cells, for generating a second output clock signal according to an input clock signal and the plurality of selecting control signals; and
a dividing unit, for dividing the second output clock signal by a rational number according to the dividing control signal to generate the first output clock signal, wherein a quantization level of the rational number is 1;
wherein the $i^{th}$ dividing cell among N dividing cells outputs one of a $i^{th}$ cell input clock signal and a $i^{th}$ cell delayed clock signal as a $i^{th}$ cell output clock signal according to the $i^{th}$ control signal, wherein the $i^{th}$ cell delayed clock signal is generated by delaying the $i^{th}$ cell input clock signal $0.5^i$ of a clock period of the input clock signal;
wherein the input clock signal is the cell input clock signal of a first dividing cell among the N dividing cells, the second output clock signal is the cell output signal of a second dividing cell among the N dividing cells, and the cell input clock signal of each of the dividing cells except the first dividing cell and the second dividing cell, hereinafter third dividing cells, is the cell output clock signal of another dividing cell among the N dividing cells.

15. The fractional dividing module of claim 14, wherein the $i^{th}$ dividing cell comprises:
a first delay unit, for delaying a $i^{th}$ cell input clock signal to generate a $i^{th}$ cell delayed input clock signal; and
a selecting unit, for selecting one of the $i^{th}$ cell input clock signal and the $i^{th}$ cell delayed clock signal as the $i^{th}$ cell output clock signal according to the $i^{th}$ control signal.

16. The fractional dividing module of claim 14, wherein when the fractional divisor is $1+0.5^m$ wherein $1 \leq m$, the control circuit generates the $i^{th}$ selecting control signal by dividing the first output clock signal by $2^{(m-i+1)}$ when $0 < i \leq m$ and maintains the $i^{th}$ selecting control signal to control the selecting unit of the $i^{th}$ dividing cell to output the first input signal when $m < i \leq N$.

17. The fractional dividing module of claim 14, further comprising:
a calibration unit, for generating a delay adjusting signal to adjust delay times of the first delay units in the N dividing cells according to the input clock signal and the first output clock signal.

18. The fractional dividing module of claim 17, wherein the calibration unit comprises:
a second delay unit, for delaying the first output clock signal according to a delay control signal to generate the delayed clock signal;
a phase detecting unit, for detecting a relation of a relative position between the first output clock signal and the delayed clock signal to generate a detecting signal; and
a computing unit, for generating a calibration signal to control the control circuit; generating the delay control signal according to the detecting signal; comparing a first clock period and a second clock period via sampling the output clock signal to generate the delay adjusting signal.

19. The fractional dividing module of claim 18, wherein the calibration signal generated by the computing unit is to control the control circuit to generate the selecting control signal by dividing the first output clock signal by $2^{(m-i+1)}$ when $0 < i \leq m$ and to generate the $i^{th}$ selecting control signal instructing the selecting unit of the $i^{th}$ dividing cell to output the $i^{th}$ cell input clock signal when $m < i \leq N$.

20. The fractional dividing module of claim 18, wherein the delay control signal generated by the computing unit is to align a first rising edge of the first clock period in the delayed clock signal with a second rising edge of the second clock period in the first output clock signal.

21. The fractional dividing module of claim 18, wherein the computing unit compares the first clock period and second clock period via sampling the first output clock signal at the second rising edge in the delayed clock signal when the first rising edge of the first clock period in the delayed clock signal aligns the second rising edge of the second clock period in the first output clock signal.

22. The fractional dividing module of claim 17, wherein the calibration unit comprises:
a second delay unit, for delaying the first output clock signal according to a first delay control signal, to generate a first delayed clock signal;
a third delay unit for delaying the first delayed clock signal according to a second delay control signal, to generate a second delayed clock signal;
a phase detecting unit, for detecting a relation of a relative position between the first output clock signal and the input clock signal, to generate an detecting signal; and
a computing unit, for generating a calibration signal to control the control circuit; generating the first delay control signal and the second delay control signal according to the detecting signal; and generating the delay adjusting signal according to a first time difference and a second time difference.

23. The fractional dividing module of claim 22, wherein the calibration signal generated by the computing unit is to control the control circuit to generate the selecting control signal by dividing the first output clock signal by $2^{(m-i+1)}$ when $0 < i \leq m$ and to generate the $i^{th}$ selecting control signal instructing the selecting unit of the $i^{th}$ dividing cell to output the $i^{th}$ cell input clock signal when $m < i \leq N$.

24. The fractional dividing module of claim 22, wherein first delay control signal generated by the computing unit is to align a first rising edge of the first clock period in the second delayed clock signal with a first reference rising edge of the input clock signal; the second delay control signal generated by the computing unit is to align a second rising edge of a second clock period in the second delayed clock signal with a second reference rising edge of the input clock signal when the first rising edge of the first clock period in the second delayed clock signal aligns with the first reference rising edge of the input clock signal, wherein the second reference rising edge is the first one rising edge ahead of the second rising edge in the input clock signal; and the computing unit acquires the time difference between the second rising edge of the second clock period in the second delayed clock signal and the second reference rising edge of the output clock signal according to the second delay control signal as the first time difference.

25. The fractional dividing module of claim 24, wherein the first delay control signal generated by the computing unit is to align the second rising edge of the second clock period in the second delayed clock signal with the second reference rising edge of the input clock signal; the second delay control signal generated by the computing unit is to align a third rising edge of a third clock period subsequent to the second clock period in the second delayed clock signal and a third reference rising edge of the input clock signal when the second rising edge of the second clock period in the second delayed clock signal aligns with the second reference rising edge of the input clock signal, wherein the third reference rising edge is the first one rising edge ahead of the third rising edge in the input clock signal; and the computing unit acquires the time difference between the third rising edge of the third clock period and the third reference rising edge of the input clock signal according to the second delay control signal as the second time difference.

26. A calibration method for a fractional dividing module comprising a control circuit, for generating N selecting control signals according to a first output clock signal and a fractional divisor; N dividing cells, for generating an second output clock signal according to an input clock signal and the plurality of selecting control signals; and a dividing unit, for dividing the second output clock signal by a rational number according to the dividing control signal to generate the first output clock signal, wherein a quantization level of the rational number is 1; wherein the $i^{th}$ dividing cell among N dividing cells outputs one of a $i^{th}$ cell input clock signal and a $i^{th}$ cell delayed clock signal as a $i^{th}$ cell output clock signal according to the $i^{th}$ control signal, wherein the $i^{th}$ cell delayed clock signal is generated by delaying the $i^{th}$ cell input clock signal $0.5^i$ of a clock period of the input clock signal; wherein the input clock signal is the cell input clock signal of a first dividing cell among the N dividing cells, the second output clock signal is the cell output signal of a second dividing cell among the N dividing cells, and the cell input clock signal of each of the dividing cells except the first dividing cell and the second dividing cell, hereinafter third dividing cells, is the cell output clock signal of another dividing cell among the N dividing cells; the calibration method comprising:
controlling the fractional dividing module to perform a function of divided-by-$(1+0.5^m)$, wherein m is a positive integer smaller than the number N of the delay cells; and adjusting a delay time of the first delay units in the in $m^{th}$ delay cell according to the input clock signal and the first output clock signal.

27. The calibration method of claim 26, wherein the step of controlling the fractional dividing module to perform the function of divided-by-$(1+0.5^m)$ comprises:

generating the $i^{th}$ selecting control signal by dividing the first output clock signal by $2^{(m-i+1)}$ when $0<i\leq m$; and generating the $i^{th}$ selecting control signal to control the selecting unit of the $i^{th}$ dividing cell to output the cell input clock signal when $m<i\leq N$.

28. The calibration method of claim 26, wherein the step of adjusting the delay time of the first delay units in the in $m^{th}$ delay cell according to the input clock signal and the first output clock signal comprises:

delaying the first output clock signal to generate a delayed clock signal;

aligning a first rising edge of a first clock period in the delayed clock signal with a second rising edge of a second clock period subsequent to the first clock period in the first output clock signal; and comparing the first clock period and second clock period via sampling the first output clock signal at the second rising edge in the delayed clock signal for generating the delay adjusting signal.

29. The calibration method of claim 26, wherein the step of adjusting the delay time of the first delay units in the in $m^{th}$ delay cell according to the input clock signal and the first output clock signal comprises:

delaying the first output clock signal to generate a first delayed clock signal;

aligning a first rising edge of the first clock period in the first delayed clock signal with a first reference rising edge of the input clock signal;

acquiring a first time difference between a second rising edge of the second clock period in the first delayed clock signal and a second reference rising edge of the input clock signal, wherein the second reference rising edge is the first one rising edge ahead of the second rising edge in the input clock signal;

aligning the second rising edge of the second clock period in the first delayed clock signal with the second reference rising edge of the input clock signal;

acquiring a second time difference between a third rising edge of a third clock period subsequent to the second clock period in the first delayed clock signal and a third reference rising edge of the input clock signal, wherein the third reference rising edge is the first one rising edge ahead of the third rising edge in the input clock signal; and comparing the first clock period and second clock period according to the first time difference and the second time difference for generating the delay adjusting signal.

* * * * *